(12) United States Patent
Nishimura et al.

(10) Patent No.: US 12,347,399 B2
(45) Date of Patent: Jul. 1, 2025

(54) SCANNING SIGNAL LINE DRIVE CIRCUIT AND DISPLAY DEVICE

(71) Applicant: Sharp Display Technology Corporation, Kameyama (JP)

(72) Inventors: Jun Nishimura, Kameyama (JP); Yoshihito Hara, Kameyama (JP); Masaki Maeda, Kameyama (JP); Yoshiharu Hirata, Kameyama (JP); Hideki Kitagawa, Kameyama (JP); Masamitsu Yamanaka, Kameyama (JP); Tohru Daitoh, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/529,438

(22) Filed: Dec. 5, 2023

(65) Prior Publication Data

US 2024/0257774 A1    Aug. 1, 2024

(30) Foreign Application Priority Data

Jan. 30, 2023   (JP) ................... 2023-011531

(51) Int. Cl.
*G09G 3/34*    (2006.01)
*G11C 19/28*   (2006.01)

(52) U.S. Cl.
CPC .......... *G09G 3/3446* (2013.01); *G11C 19/28* (2013.01); *G09G 2300/0426* (2013.01); *G09G 2310/0267* (2013.01); *G09G 2310/0286* (2013.01); *G09G 2310/08* (2013.01)

(58) Field of Classification Search
CPC ......... G09G 3/3446; G09G 2300/0426; G09G 2310/0267; G09G 2310/0286; G09G 2310/08; G11C 19/28
See application file for complete search history.

(56) References Cited

U.S. PATENT DOCUMENTS

| | | | | |
|---|---|---|---|---|
| 5,450,357 A | * | 9/1995 | Coffman | G11C 16/12 365/189.11 |
| 8,633,480 B2 | * | 1/2014 | Yamazaki | G11C 19/28 257/70 |
| 2013/0069930 A1 | | 3/2013 | Fukaya et al. | |

FOREIGN PATENT DOCUMENTS

WO    2011/114569 A1    9/2011

* cited by examiner

*Primary Examiner* — Matthew A Eason
*Assistant Examiner* — Scott D Au
(74) *Attorney, Agent, or Firm* — ScienBiziP, P.C.

(57) ABSTRACT

In each of unit circuits that constitute a shift register, a first conduction terminal of a second thin-film transistor that controls the output of an output signal serving as a scanning signal is given a second input clock signal having a amplitude larger than the amplitude of a first input clock signal that is given to a first conduction terminal of a first thin-film transistor that controls the output of an output signal serving as a control signal for controlling another unit circuit. The channel length of the second thin-film transistor is set to be greater than the channel length of the first thin-film transistor, so that the breakdown voltage of the second thin-film transistor is higher than the breakdown voltage of the first thin-film transistor.

20 Claims, 16 Drawing Sheets

CHANNEL LENGTH DIRECTION

SCANNING SIGNAL LINE DRIVE CIRCUIT AND DISPLAY DEVICE

BACKGROUND

1. Field

The present disclosure relates to a display device and, in particular, to a scanning signal line drive circuit of a display device that employs an electrophoretic element as a display element.

2. Description of the Related Art

Display devices, such as liquid crystal display devices and organic EL display devices, are widely used. In recent years, demand for display devices called "electronic paper" has been increasing. Electronic paper is used, for example, in e-book devices for reading electronic books. Several display methods have been developed for electronic paper. Among them, the electrophoresis method has become mainstream that uses microcapsules containing positively charged black particles and negatively charged white particles (or positively charged white particles and negatively charged black particles) inside.

The above-noted display devices generally employ the active matrix driving method. A display unit of an active matrix display device is provided with a plurality of source bus lines (video signal lines) and a plurality of gate bus lines (scanning signal lines). Pixel forming portions each forming a pixel are provided at the intersection of the plurality of source bus lines and gate bus lines. Each of the pixel forming portions includes a pixel capacitor for holding a pixel voltage value. The display device further includes a gate driver (a scanning signal line drive circuit) for driving the gate bus lines and a source driver (a video signal line drive circuit) for driving the source bus lines. The gate driver is composed of a shift register having a plurality of stages so that a plurality of gate bus lines are sequentially selected for a predetermined period. Active scanning signals are sequentially output from the plurality of stages.

In general, the gate driver is in the form of an integrated circuit (IC) chip and is mounted in a peripheral part of a substrate that makes up the display panel. In recent years, it has become increasingly common to form a gate driver directly on a substrate. Such a gate driver is called a "monolithic gate driver".

Hereinafter, a circuit that constitutes each of the stages of the shift register is referred to as a "unit circuit". For n-channel thin-film transistors, the drain or source, whichever has a higher potential, is called a "drain". However, in some thin-film transistors in the unit circuit described below, the drain and source are swapped during operation. For this reason, hereinafter, one of two terminals each functioning as a drain or a source is referred to as a "first conduction terminal", and the other is referred to as a "second conduction terminal". Furthermore, a terminal that functions as a gate of a thin-film transistor is referred to as a "control terminal". However, the terms "gate", "drain", and "source" are also used as appropriate.

FIG. 20 is a circuit diagram of a configuration example of an existing unit circuit included in a monolithic gate driver. The unit circuit includes three thin-film transistors T91 to T93 and one capacitor (capacitive element) C91. Furthermore, the unit circuit includes an input terminal for a low-level DC power supply voltage VSS, three input terminals 91 to 93, and one output terminal 99. An output signal from a unit circuit constituting a preceding stage is given to the input terminal 91 as a set signal S, an output signal from a unit circuit constituting a succeeding stage is given to the input terminal 92 as a reset signal R, and one of a plurality of clock signals for operating the shift register is given to the input terminal 93 as an input clock signal CLKin. An output signal Q output from the output terminal 99 is given as a scanning signal to the corresponding gate bus line. In addition, the output signal Q is given as a reset signal R to the unit circuit constituting the preceding stage and is given as a set signal S to the unit circuit constituting the succeeding stage. A node connected to the control terminal of the thin-film transistor T93 is referred to as a "control node", and the control node is generally identified by reference numeral N9.

The operation performed by the unit circuit illustrated in FIG. 20 is described below with reference to FIG. 21. Hereinafter, a period during which the operation is performed in each unit circuit to cause the corresponding gate bus line to enter a selection mode is referred to as a "selection operation period", and a period other than the selection operation period is referred to as a "normal operation period". In the example illustrated in FIG. 21, the period before time t91 and the period after time t94 are the normal operation period, and the period from time t91 to time t94 is the selection operation period.

In a period before time t91, the potential of control node N9 and the potential of the output signal Q (the potential of the output terminal 99) are at a low level.

At time t91, the set signal S changes from low level (off level) to high level (on level). As illustrated in FIG. 20, the thin-film transistor T91 is diode connected. For this reason, when the set signal S changes to high level, the thin-film transistor T91 is turned on, which charges the capacitor C91. As a result, the potential of the control node N9 changes from low level to high level, and the thin-film transistor T93 is turned on. During the period from time t91 to time t92, the input clock signal CLKin is maintained at a low level. Therefore, the output signal Q is maintained at a low level during the period.

At time t92, the input clock signal CLKin changes from low level to high level. At this time, since the thin-film transistor T93 is turned on, the potential of the output terminal 99 increases with increasing potential of the input terminal 93. As illustrated in FIG. 20, since the capacitor C91 is provided between the control node N9 and the output terminal 99, the potential of the control node N9 also increases with increasing potential of the output terminal 99 (the control node N9 enters a boosted state). As a result, a high voltage is applied to the control terminal of the thin-film transistor T93, and the potential of the output signal Q increases to a level sufficient to cause the gate bus line connected to the output terminal 99 to enter a selection mode.

At time t93, the input clock signal CLKin changes from high level to low level. As a result, the potential of the output terminal 99 decreases with decreasing potential of the input terminal 93. That is, the potential of the output signal Q becomes low level. In addition, the potential of the control node N9 decreases via the capacitor C91.

At time t94, the reset signal R changes from low level to high level. This turns on the thin-film transistor T92. As a result, the potential of control node N9 is at a low level. When the potential of the control node N9 is at low level, the thin-film transistor T93 is turned off.

The above-described operations are performed in all the unit circuits forming the shift register and, thus, a plurality of gate bus lines sequentially enter a selection mode for a predetermined period.

Nowadays, display devices are expected to reduce power consumption. International Publication No. 2011/114569 pamphlet describes a technique to reduce power consumption of a display device including a monolithic gate driver. In the technique, an output terminal that outputs the scanning signal and an output terminal that outputs control signals (the set signal and the reset signal) to be provided to the unit circuit constituting another stage are provided in each of the unit circuits. In addition, the amplitude of a clock signal for the control signal is set to be less than that of a clock signal for the scanning signal (the high-level side potential of a clock signal for the control signal is set to be lower than that of a clock signal for the scanning signal).

The technique described in International Publication No. 2011/114569 pamphlet is a technique related to liquid crystal display devices. If the technique is applied to electronic paper, element destruction or characteristic deterioration may occur in thin-film transistors in a unit circuit, which is described in more detail below.

To drive electronic paper that uses the electrophoresis method, a higher voltage signal than that used to drive a liquid crystal display device is selected. Therefore, the technique described in International Publication No. 2011/114569 pamphlet can be applied to electronic paper so that the amplitude of the clock signal for the control signal is less than or equal to the amplitude of the clock signal in the liquid crystal display device, and the amplitude of the clock signal for the scanning signal is greater than the amplitude of the clock signal in a liquid crystal display device. However, in this case, the probability of element destruction or characteristic deterioration is lower than in the configuration in which the amplitude of the clock signal is increased using the circuit illustrated in FIG. 20, but for some thin-film transistors, element destruction or characteristic deterioration may occur due to such a high voltage (a voltage higher than the VDS breakdown voltage) applied between the drain and source.

Accordingly, the present disclosure provides a display device (for example, electronic paper) including a monolithic gate driver capable of driving gate bus lines (scanning signal lines) using a high-voltage signal without causing element destruction or characteristic deterioration of a thin-film transistor.

SUMMARY

According to an embodiment of the present disclosure, a display device includes a scanning signal line drive circuit configured to drive a plurality of scanning signal lines each connected to a plurality of pixel forming portions, wherein the scanning signal line drive circuit includes a shift register having a plurality of stages corresponding to the plurality of scanning signal lines on a one-to-one basis and configured to operate based on a plurality of first clock signals and a plurality of second clock signals each having a magnitude that is greater than a magnitude of each of the first clock signals, wherein a unit circuit that constitutes one of the stages included in the shift register includes a first output node configured to output a control signal for controlling an operation performed by another one of the unit circuits, a second output node configured to output a scanning signal to a corresponding one of the scanning signal lines, a first control node configured to change from an off level to an on level based on a control signal output from a first output node of the unit circuit that constitutes a preceding stage, a first output control transistor including a control terminal connected to the first control node, a first conduction terminal to which a corresponding one of the first clock signals is given, and a second conduction terminal connected to the first output node, and a second output control transistor including a control terminal connected to the first control node, a first conduction terminal to which a corresponding one of the second clock signals is given, and a second conduction terminal connected to the second output node, and wherein a breakdown voltage of the second output control transistor is higher than a breakdown voltage of the first output control transistor.

According to another embodiment of the present disclosure, a scanning signal line drive circuit for driving a plurality of scanning signal lines includes a shift register having a plurality of stages corresponding to the plurality of scanning signal lines on a one-to-one basis and configured to operate based on a plurality of first clock signals and a plurality of second clock signals each having a magnitude that is greater than a magnitude of each of the first clock signals, wherein a unit circuit that constitutes one of the stages included in the shift register includes a first output node configured to output a control signal for controlling an operation performed by another one of the unit circuits, a second output node configured to output a scanning signal to a corresponding one of the scanning signal lines, a first control node configured to change from an off level to an on level based on a control signal output from a first output node of the unit circuit that constitutes a preceding stage, a first output control transistor including a control terminal connected to the first control node, a first conduction terminal to which a corresponding one of the first clock signals is given, and a second conduction terminal connected to the first output node, and a second output control transistor including a control terminal connected to the first control node, a first conduction terminal to which a corresponding one of the second clock signals is given, and a second conduction terminal connected to the second output node, and wherein a breakdown voltage of the second output control transistor is higher than a breakdown voltage of the first output control transistor.

DESCRIPTION OF THE EMBODIMENTS

Exemplary embodiments are described below with reference to the accompanying drawings. As used herein, the term "breakdown voltage of a thin-film transistor" is used to refer to a breakdown voltage between the drain and source (between the first conduction terminal and the second conduction terminal) of a thin-film transistor.

1. First Embodiment 1.1 Overall Configuration and Operation Overview

Figure 2:
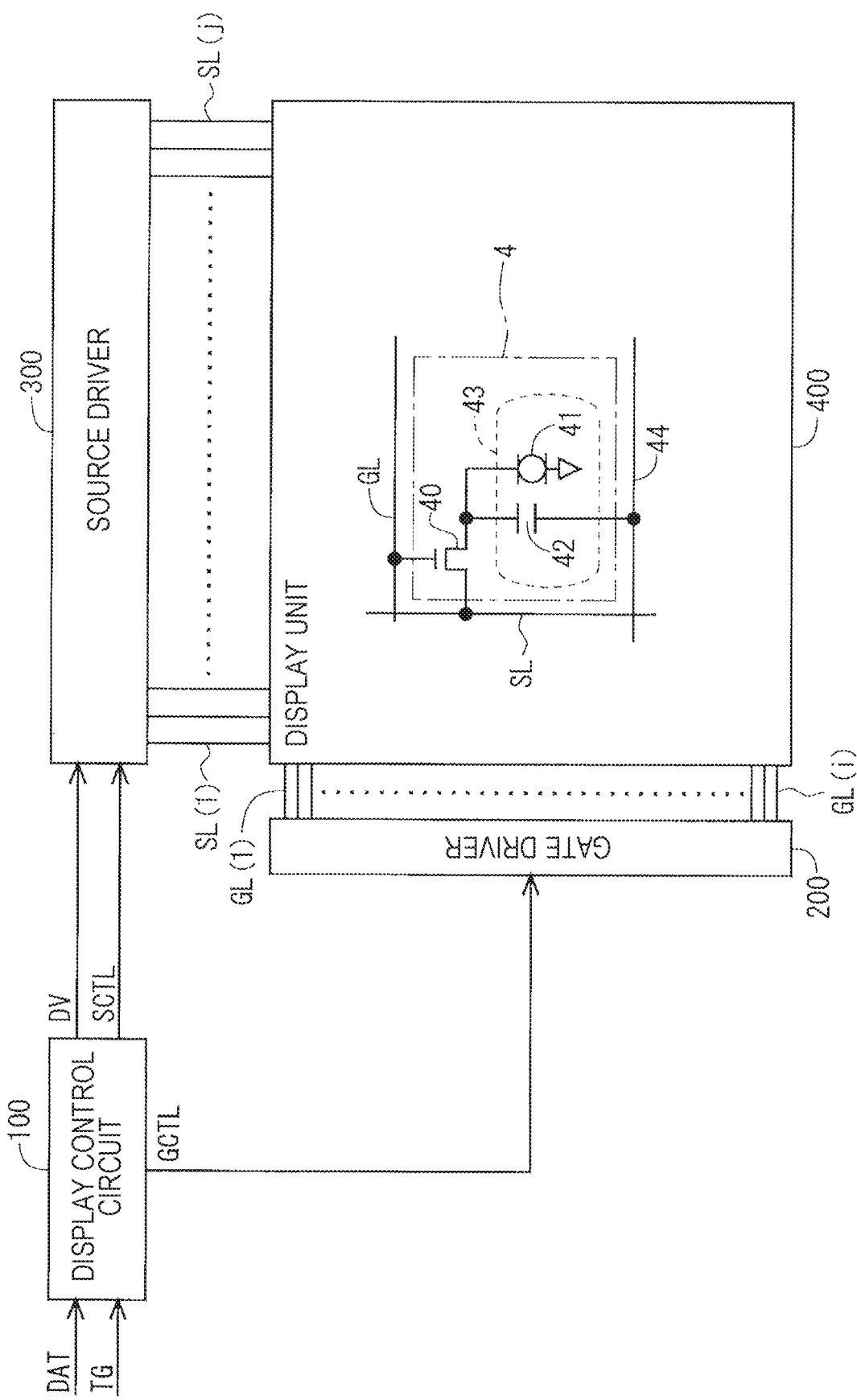
FIG. 2 is a block diagram of the overall configuration of an active matrix electrophoretic display device (electronic paper) according to the first embodiment.

FIG. 2 is a block diagram of the overall configuration of an active matrix electrophoretic display device (electronic paper) according to the first embodiment. As illustrated in FIG. 2, the electrophoretic display device includes a display control circuit 100, a gate driver (scanning signal line drive circuit) 200, a source driver (video signal line drive circuit) 300, and a display unit 400. The gate driver 200 according to the present embodiment is the monolithic gate driver described above.

The display unit 400 includes a plurality of (j) source bus lines (video signal lines) SL(1) to SL(j) and a plurality of (i) gate bus lines (scanning signal lines) GL(1) to GL(i). A pixel forming portion 4 that forms a pixel is provided at each intersection of the plurality of (j) source bus lines SL(1) to SL(j) and the plurality of (i) gate bus lines GL(1) to GL(i). That is, the display unit 400 includes a plurality of (i×j) pixel forming portions 4. However, in FIG. 2, only one pixel forming portion 4 is illustrated. Each of the pixel forming portions 4 includes a thin-film transistor 40, an electrophoretic element 41, and a storage capacitor 42. The electrophoretic element 41 and the storage capacitor 42 form a pixel capacitor 43. A control terminal of the thin-film transistor 40 is connected to a gate bus line GL, and a first conduction terminal of the thin-film transistor 40 is connected to a source bus line SL. The storage capacitor 42 includes an electrode connected to the second conduction terminal of the thin-film transistor 40 and an electrode connected to storage capacitor wiring 44. The electrophoretic element 41 is described in more detail below.

As the thin-film transistor 40 in the pixel forming portion 4, a thin-film transistor (an oxide TFT) having a channel layer formed of an oxide semiconductor is employed, for example. As the oxide TFT, an IGZO-TFT (a thin-film transistor having a channel layer formed of an oxide semiconductor containing indium, gallium, zinc, and oxygen) is used, for example. The same applies to the thin-film transistor in the gate driver 200.

The display control circuit 100 receives an image signal DAT and a timing signal group TG, such as a horizontal synchronization signal and a vertical synchronization signal, sent from the outside and outputs a digital video signal DV, a gate control signal GCTL for controlling the operation performed by the gate driver 200, and a source control signal SCTL for controlling the operation performed by a source driver 300. That is, the display control circuit 100 controls the operations performed by the gate driver 200 and the source driver 300. The gate control signal GCTL includes a gate start pulse signal, a gate end pulse signal, and a gate clock signal, and the source control signal SCTL includes a source start pulse signal, a source clock signal, and a latch strobe signal.

The gate driver 200 repeats application of the active scanning signal to each of the gate bus lines GL at every vertical scanning period on the basis of the gate control signal GCTL sent from the display control circuit 100. Note that a configuration can be employed in which the gate drivers 200 are provided on either side of the gate bus line GL (that is, a configuration in which the gate driver 200 is provided on the right and left sides of the display unit 400 in FIG. 2). The gate driver 200 is described in more detail below.

The source driver 300 applies driving video signals to the source bus lines SL(1) to SL(j) on the basis of the digital video signal DV and the source control signal SCTL sent from the display control circuit 100. At this time, the source driver 300 sequentially holds the digital video signal DV indicating the voltage to be applied to each source bus line SL at the time when the pulse of the source clock signal is generated. Then, the above-described held digital video signal DV is converted into an analog voltage at the time when a pulse of the latch strobe signal is generated. The converted analog voltage is simultaneously applied to all the source bus lines SL(1) to SL(j) as a driving video signal.

As described above, the scanning signal is applied to the gate bus lines GL(1) to GL(i), and the driving video signal is applied to the source bus lines SL(1) to SL(j), so that an image based on the image signal DAT sent from the outside is displayed on the display unit 400.

1.2 Electrophoretic Element

The electrophoretic display device according to the present embodiment employs an electrophoretic element 41 as a display element. As illustrated FIGS. 3A and 3B, the electrophoretic element 41 includes a pixel electrode 45 connected to the second conduction terminal of the thin-film transistor 40, a counter electrode 46, and a microcapsule 410 disposed between the pixel electrode 45 and the counter electrode 46. The microcapsule 410 contains, for example, positively charged black particles 411 and negatively charged white particles 412 inside. According to the present embodiment, the electrophoretic display device is configured so that a viewer views an image displayed on the display unit 400 from the side adjacent to the counter electrode 46.

Figure 3A:
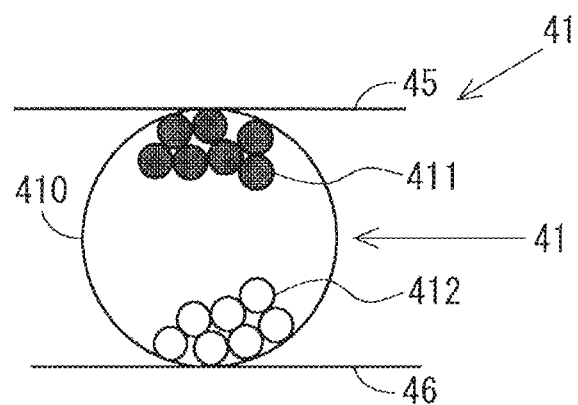
FIGS. 3A and 3B illustrate the configuration of an electrophoretic element and the operation performed by the electrophoretic element according to the first embodiment.
Figure 3B:
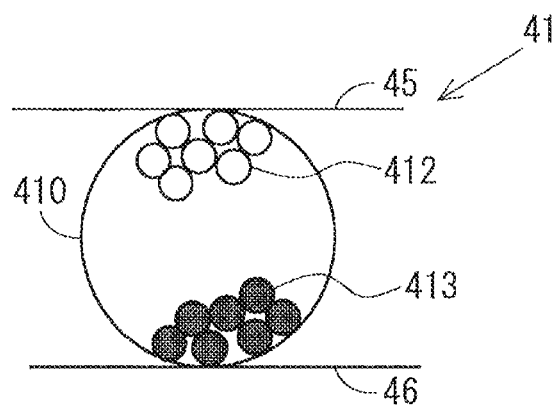

As illustrated FIG. 3A, when the potential of the pixel electrode 45 is lower than the potential of the counter electrode 46, the black particles 411 are attracted to the pixel electrode 45, and the white particles 412 are attracted to the counter electrode 46. This causes white to be displayed. As illustrated in FIG. 3B, when the potential of the pixel electrode 45 is higher than the potential of the counter electrode 46, the white particles 412 are attracted to the pixel electrode 45, and the black particles 411 are attracted to the counter electrode 46. This causes black to be displayed. According to the present embodiment, gradation display is performed by controlling the potential of the pixel electrode 45 on the basis of the image signal DAT.

1.3 Gate Driver

The gate driver 200 according to the present embodiment is described below.

1.3.1 Overview

Figure 4:
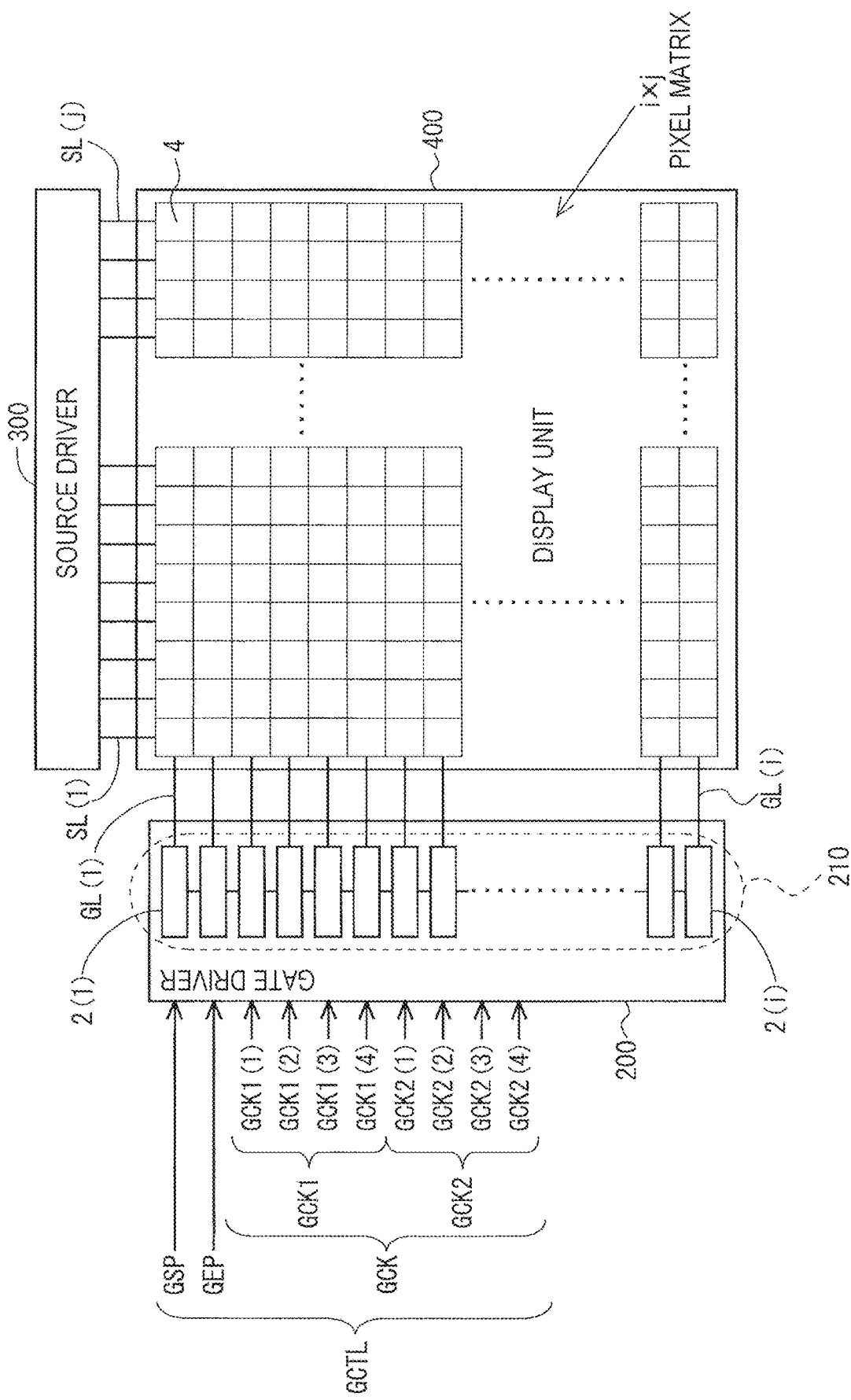
FIG. 4 is a block diagram of a schematic configuration of a gate driver according to the first embodiment.

FIG. 4 is a block diagram of the schematic configuration of the gate driver 200 according to the present embodiment. In the display unit 400, i gate bus lines GL(1) to GL(i) are arranged, and a plurality of pixel forming portions 4 are connected to each of the gate bus lines GL. That is, the gate driver 200 drives the plurality of gate bus lines GL each connected to a plurality of pixel forming portions 4.

As illustrated in FIG. 4, the gate driver 200 is composed of a shift register 210 having multiple stages. A pixel matrix with i rows and j columns is formed in the display unit 400, and the stages of the shift register 210 are provided so as to have one-to-one correspondence with the rows of the pixel matrix. That is, the shift register 210 includes i unit circuits 2(1) to 2(i). Note that a unit circuit serving as a dummy stage may be provided before the first stage or after the i-th stage. However, because this is not related to the subject matter of the present disclosure, description of the dummy stages is not given here.

The shift register 210 is supplied with a gate start pulse signal GSP, a gate end pulse signal GEP, and a gate clock signal GCK as gate control signals GCTL. The gate clock signal GCK consists of first clock signals GCK1(1) to GCK1(4), which are four-phase clock signals, and second clock signals GCK2(1) to GCK2(4), which are four-phase clock signals. The first clock signals GCK1(1) to GCK1(4) are collectively referred to as a first clock signal GCK1, and the second clock signals GCK2(1) to GCK2(4) are collectively referred to as a second clock signal GCK2. As illustrated FIGS. 5A and 5B, an amplitude V(2) of the second clock signal GCK2 is greater than an amplitude V(1) of the first clock signal GCK1. The amplitude V(1) of the first clock signal GCK1 is less than or equal to the amplitude of the clock signal used to drive the liquid crystal display device, and the amplitude V(2) of the second clock signal GCK2 is greater than the amplitude of the clock signal used to drive the liquid crystal display device. The phase of the first clock signal GCK1(1) and the phase of the second clock signal GCK2(1) are the same, and the phase of the first clock signal GCK1(2) and the phase of the second clock signal GCK2(2) are the same. The phase of the first clock signal GCK1(3) and the phase of the second clock signal GCK2(3) are the same, and the phase of the first clock signal GCK1(4) and the phase of the second clock signal GCK2(4) are the same. The configuration of the gate driver 200 and the operation performed by the gate driver 200 are described in detail below.

1.3.2 Configuration of Shift Register

Figure 6:
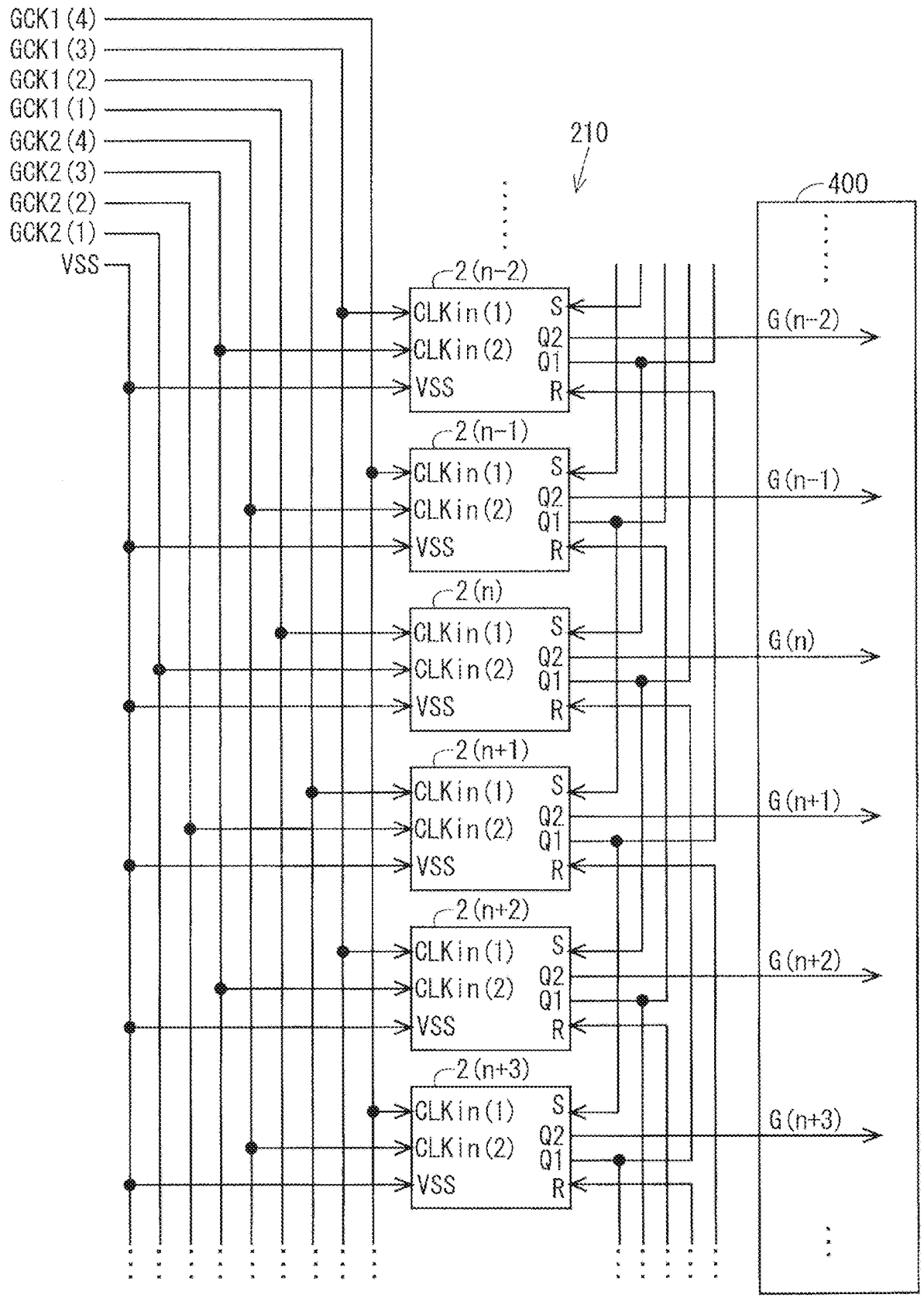
FIG. 6 is a block diagram of the configuration of a shift register according to the first embodiment.

FIG. 6 is a block diagram of the configuration of the shift register 210 in the gate driver 200. As described above, the shift register 210 is composed of i unit circuits 2(1) to 2(i). However, FIG. 6 illustrates the unit circuits 2(n−2) to 2(n+3) from the (n−2)th stage to the (n+3)th stage. Hereinafter, if there is no reason to distinguish i unit circuits 2(1) to 2(i) from one another, the unit circuit is generally identified by reference numeral 2.

As described above, the shift register 210 is supplied with the gate start pulse signal GSP, the gate end pulse signal GEP, the first clock signals GCK1(1) to GCK1(4), and the second clock signal GCK2(1) to GCK2(4) as the gate control signal GCTL. Furthermore, the shift register 210 is supplied with a low-level DC power supply voltage VSS. Hereinafter, the potential corresponding to the low-level DC power supply voltage VSS is referred to as "VSS potential" for convenience.

Figure 7:
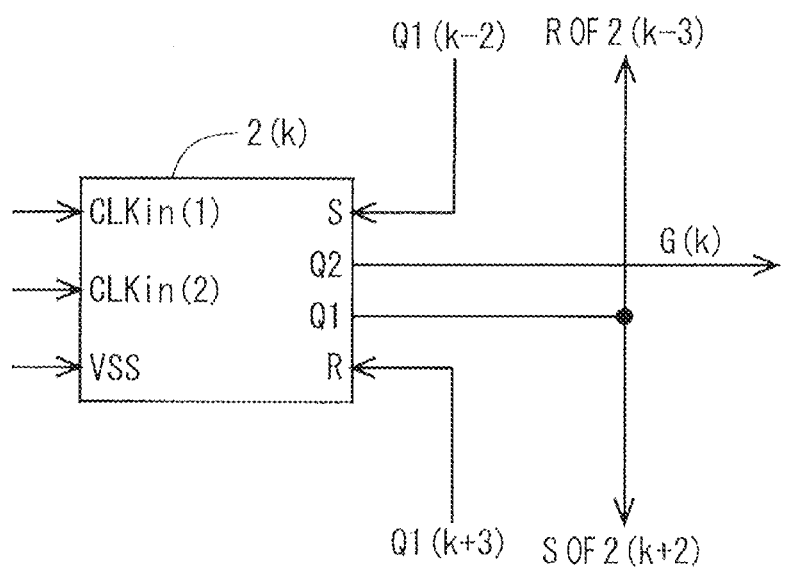
FIG. 7 illustrates input/output signals of the unit circuit according to the first embodiment.

The signals given to the input terminals in each stage (each of the unit circuits 2) of the shift register 210 are as follows (refer to FIG. 6). In terms of the gate clock signal GCK, the first clock signal GCK1(3) is given as the first input clock signal CLKin(1), and the second clock signal GCK2(3) is given as the second input clock signal CLKin(2) to the (n−2)th stage unit circuit 2(n−2). The first clock signal GCK1(4) is given as the first input clock signal CLKin(1), and the second clock signal GCK2(4) is given as the second input clock signal CLKin(2) to the (n−1)th stage unit circuit 2(n−1). The first clock signal GCK1(1) is given as the first input clock signal CLKin(1), and the second clock signal GCK2(1) is given as the second input clock signal CLKin(2) to the n-th stage unit circuit 2(n). The first clock signal GCK1(2) is given as the first input clock signal CLKin(1), and the second clock signal GCK2(2) is given as the second input clock signal CLKin(2) to the (n+1)th stage unit circuit 2(n+1). The configuration is repeated for four stages at a time through all the stages of the shift register 210. Furthermore, as illustrated in FIG. 7, to the unit circuit 2(k) of any stage (in the present example, the k-th stage, where k is an integer greater than or equal to 1 and less than or equal to i), a first output signal Q1(k−2) output from the unit circuit 2(k−2), which is the unit circuit two stages before the unit circuit 2(k), is given as the set signal S, and a first output signal Q1(k+3) output from the unit circuit 2(k+3), which is three stages after the unit circuit 2(k), is given as the reset signal R. However, the gate start pulse signal GSP is given as the set signal S to a predetermined number of unit circuits 2 on the first stage side, and the gate end pulse signal GEP is given as the reset signal R to a predetermined number of unit circuits 2 on the final stage side. In terms of the gate start pulse signal GSP, only one gate start pulse signal GSP may be used, or a plurality of gate start pulse signals GSP may be used. The same applies to the gate end pulse signal GEP. The low-level DC power supply voltage VSS is commonly applied to all the unit circuits 2(1) to 2(i).

Two output signals (the first output signal Q1 and a second output signal Q2) are output from each of the stages (each of the unit circuits 2) of the shift register 210. The first output signal Q1 output from any one of stages (in the present example, the k-th stage: k is an integer greater than or equal to 1 and less than or equal to i) is given as the reset signal R to the unit circuit 2(k−3), which is three stages before the current stage and is also given as a set signal S to the unit circuit 2(*k*+2), which is two stages after the current stage (refer to FIG. 7). The second output signal Q2 output from an any stage (in the present example, the k-th stage: k is an integer greater than or equal to 1 and less than or equal to i) is given as the scanning signal G(k) to the gate bus line GL(k) in the k-th row (refer to FIG. 7).

Figure 8:
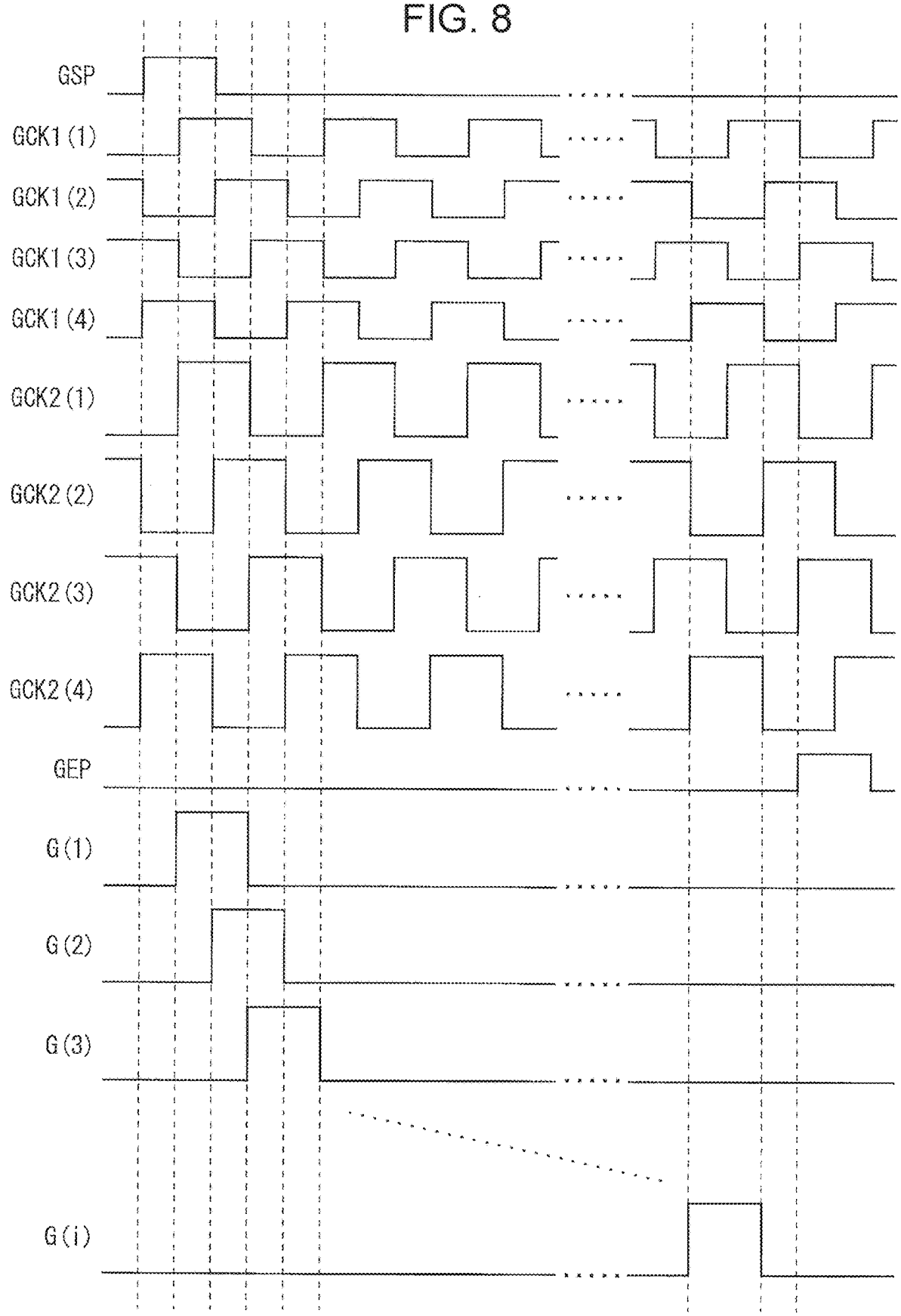
FIG. 8 is a signal waveform diagram illustrating the operation performed by the gate driver according to the first embodiment.

FIG. 8 is a signal waveform diagram describing the operation performed by the gate driver 200. According to the above-described configuration, when a pulse of the gate start pulse signal GSP is given to the shift register 210, a shift pulse included in the first output signal Q1 output from each of the unit circuits 2 is transferred on the basis of the clock operation of the four-phase first clock signals GCK1(1) to GCK1(4). In accordance with the transfer of the shift pulse, the second output signal Q2 output from each of the unit circuits 2 sequentially becomes high level on the basis of the clock operation of the 4-phase second clock signals GCK2(1) to GCK2(4). As a result, as illustrated in FIG. 8, the scanning signals G(1) to G(i), which become high level (active) sequentially for a predetermined period, are given to gate bus lines GL(1) to GL(i) in the display unit 400. That is, the i gate bus lines GL(1) to GL(i) sequentially enters a selection mode. Thereafter, a pulse of the gate end pulse signal GEP is given to the shift register 210.

In the present example, the first output signal Q1 output from each of the unit circuits 2 is given as a reset signal R to the unit circuit 2 in three stages before the unit circuit 2 and is given as a set signal S to the unit circuit in two stages after the unit circuit 2. However, the present embodiment is not limited thereto. Furthermore, in the present example, the first clock signal GCK1 and the second clock signal GCK2 are four-phase clock signals. However, the number of phases of the clock signals is not limited to four.

1.3.3 Configuration of Unit Circuit

Figure 1:
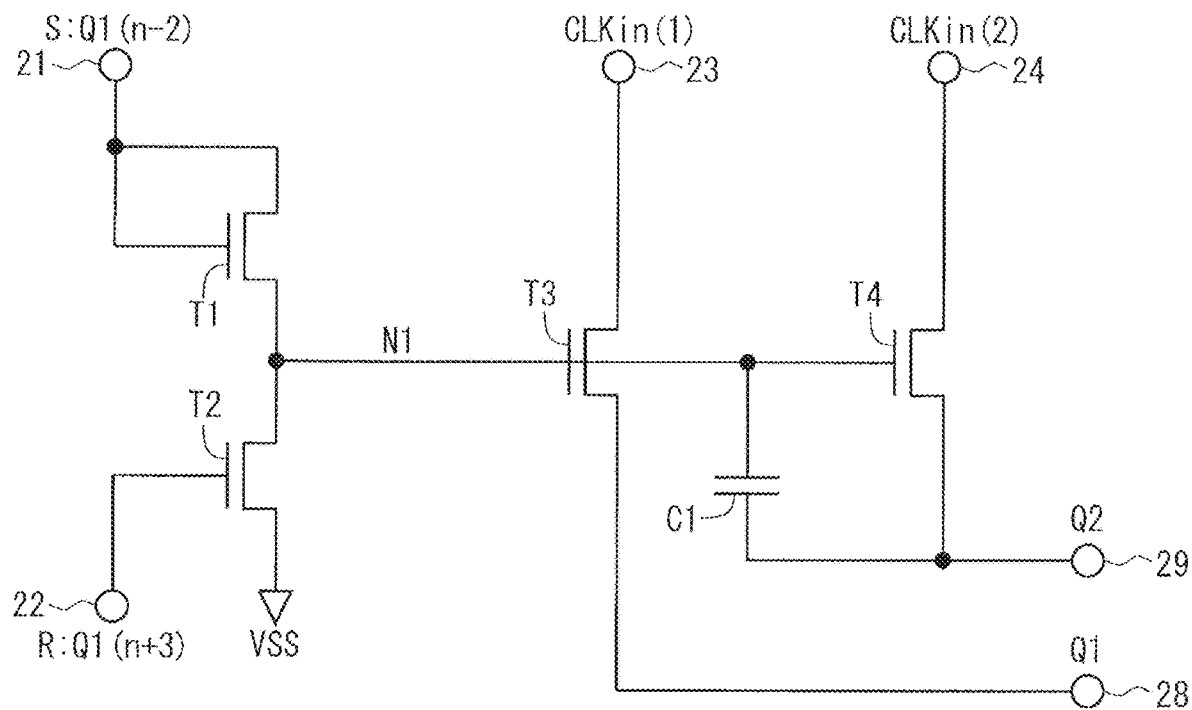
FIG. 1 is a circuit diagram illustrating the configuration of a unit circuit (the configuration of one stage of a shift register) according to a first embodiment.

FIG. 1 is a circuit diagram of the configuration of the unit circuit 2 (the configuration of the shift register 210 for one stage) according to the present embodiment. As illustrated in FIG. 1, the unit circuit 2 includes four thin-film transistors T1 to T4 and one capacitor (capacitive element) C1. The thin-film transistors T1 to T4 are, for example, n-channel type IGZO-TFTs. In addition, the unit circuit 2 includes an input terminal for a low-level DC power supply voltage VSS (that is, an input terminal to which a low-level (off-level) potential is supplied), four input terminals 21 to 24, and two output terminals 28 and 29. The input terminal 21 receives the set signal S, the input terminal 22 receives the reset signal R, and the input terminal 23 receives the first input clock signal CLKin(1), and the input terminal 24 receives the second input clock signal CLKin(2). Furthermore, the output terminal 28 outputs the first output signal Q1, and the output terminal 29 outputs the second output signal Q2. As used herein, the node connected to the control terminal of the thin-film transistor T3 and the control terminal of the thin-film transistor T4 is referred to as a "first control node", and the first control node is generally identified by reference numeral N1.

The control terminal and the first conduction terminal of the thin-film transistor T1 are connected to an input terminal 21 (that is, diode connected), and the second conduction terminal is connected to the first control node N1. The control terminal of the thin-film transistor T2 is connected to the input terminal 22, the first conduction terminal is connected to the first control node N1, and the second conduction terminal is connected to the input terminal for the low-level DC power supply voltage VSS. The control terminal of the thin-film transistor T3 is connected to the first control node N1, the first conduction terminal is connected to the input terminal 23, and the second conduction terminal is connected to the output terminal 28. The control terminal of the thin-film transistor T4 is connected to the first control node N1, the first conduction terminal is connected to the input terminal 24, and the second conduction terminal is connected to the output terminal 29. One end of a capacitor C1 is connected to the first control node N1, and the other end is connected to the output terminal 29.

According to the present embodiment, the thin-film transistor T1 forms a set transistor, the thin-film transistor T2 forms a reset transistor, the thin-film transistor T3 forms a first output control transistor, the thin-film transistor T4 forms a second output control transistor, the output terminal 28 forms a first output node, and the output terminal 29 forms a second output node.

1.3.4 Breakdown Voltage of Thin-Film Transistor

Figure 5A:
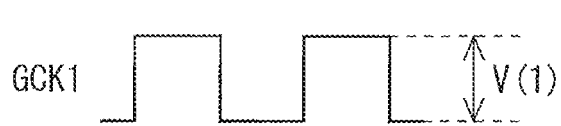
FIGS. 5A and 5B illustrate the relationship between the amplitude of a first clock signal and the amplitude of a second clock signal according to the first embodiment.
Figure 5B:
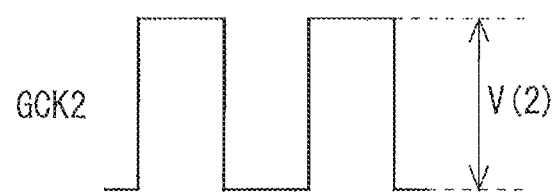
Figure 9A:
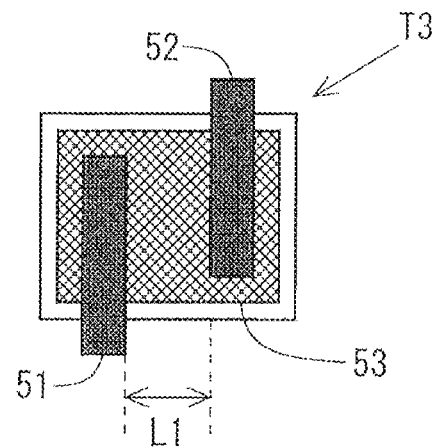
FIGS. 9A and 9B illustrate the structure for increasing the breakdown voltage of a thin-film transistor according to the first embodiment.
Figure 9B:
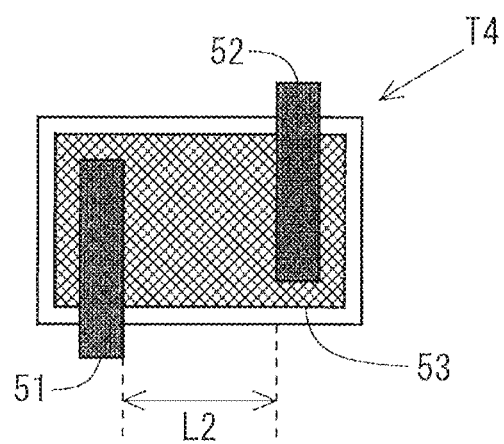

Each of the unit circuits 2 is given one of the four-phase first clock signals GCK1(1) to GCK1(4) as the first input clock signal CLKin(1) and is given one of the four-phase second clock signal GCK2(1) to GCK2(4) as the second input clock signal CLKin(2). As illustrated in FIGS. 5A and 5B, the amplitude V(2) of the second clock signal GCK2 is greater than the amplitude V(1) of the first clock signal GCK1. Therefore, a high voltage is applied between the drain and source (between the first conduction terminal and the second conduction terminal) of the thin-film transistor T4. According to the present embodiment, to reduce the element destruction and characteristic deterioration of the thin-film transistor T4, a channel length L2 of the thin-film transistor T4 is set to be greater than a channel length L1 of the thin-film transistor T3, as illustrated in FIGS. 9A and 9B (FIGS. 9A and 9B are plan views of the thin-film transistor T3 and the thin-film transistor T4, respectively). That is, the breakdown voltage of the thin-film transistor T4 is higher than that of the thin-film transistor T3. In FIGS. 9A and 9B, a terminal 51 is one of the first conduction terminal and the second conduction terminal on the $n^+$ type region, and a terminal 52 is the other of the first conduction terminal and the second conduction terminal on the $n^+$ type region. A layer 53 is a semiconductor layer (the same applies to FIGS. 12, 13, and 15).

1.3.5 Operation Performed by Unit Circuit

The operation performed by the unit circuit 2 according to the present embodiment is described below with reference to FIG. 10. In the present example, the period before time t11 and the period after time t14 are the normal operation period, and the period from time t11 to time t14 is a selection operation period.

In the period before time t11, the potential of the first control node N1, the potential of the first output signal Q1 (the potential of the output terminal 28), and the potential of the second output signal Q2 (the potential of the output terminal 29) are at low level (off level).

At time t11, the set signal S changes from low level (off level) to high level (on level). Since the thin-film transistor T1 is diode connected as illustrated in FIG. 1, the thin-film transistor T1 is turned on when the set signal S changes to a high level and, thus, the capacitor C1 is charged. As a result, the potential of the first control node N1 changes from low level to high level, and the thin-film transistor T3 and the thin-film transistor T4 are turned on. During the period from time t11 to time t12, the first input clock signal CLKin(1) and the second input clock signal CLKin(2) are maintained at a low level. Therefore, during this period, the first output signal Q1 and the second output signal Q2 are maintained at a low level.

At time t12, the set signal S changes from high level to low level. This causes the thin-film transistor T1 to be turned off. Furthermore, at time t12, the first input clock signal CLKin(1) and the second input clock signal CLKin(2) change from low level to high level. At this time, since the thin-film transistor T3 is turned on, the potential of the output terminal 28 (the potential of the first output signal Q1) increases with increasing potential of the input terminal 23, and the potential of the output terminal 29 (the potential of the second output signal Q2) increases with increasing potential of the input terminal 24. Since, as illustrated in FIG. 1, the capacitor C1 is provided between the first control node N1 and the output terminal 29, the potential of the first control node N1 also increases with increasing potential of the output terminal 29 (The first control node N1 enters a boosted state). As a result, a high voltage is applied to the control terminals of the thin-film transistors T3 and T4. The application of a high voltage to the control terminal of the thin-film transistor T4 in this manner increases the potential of the second output signal Q2 to a level sufficient to cause the gate bus line GL(n) connected to the output terminal 29 to enter the selection mode.

Figure 10:
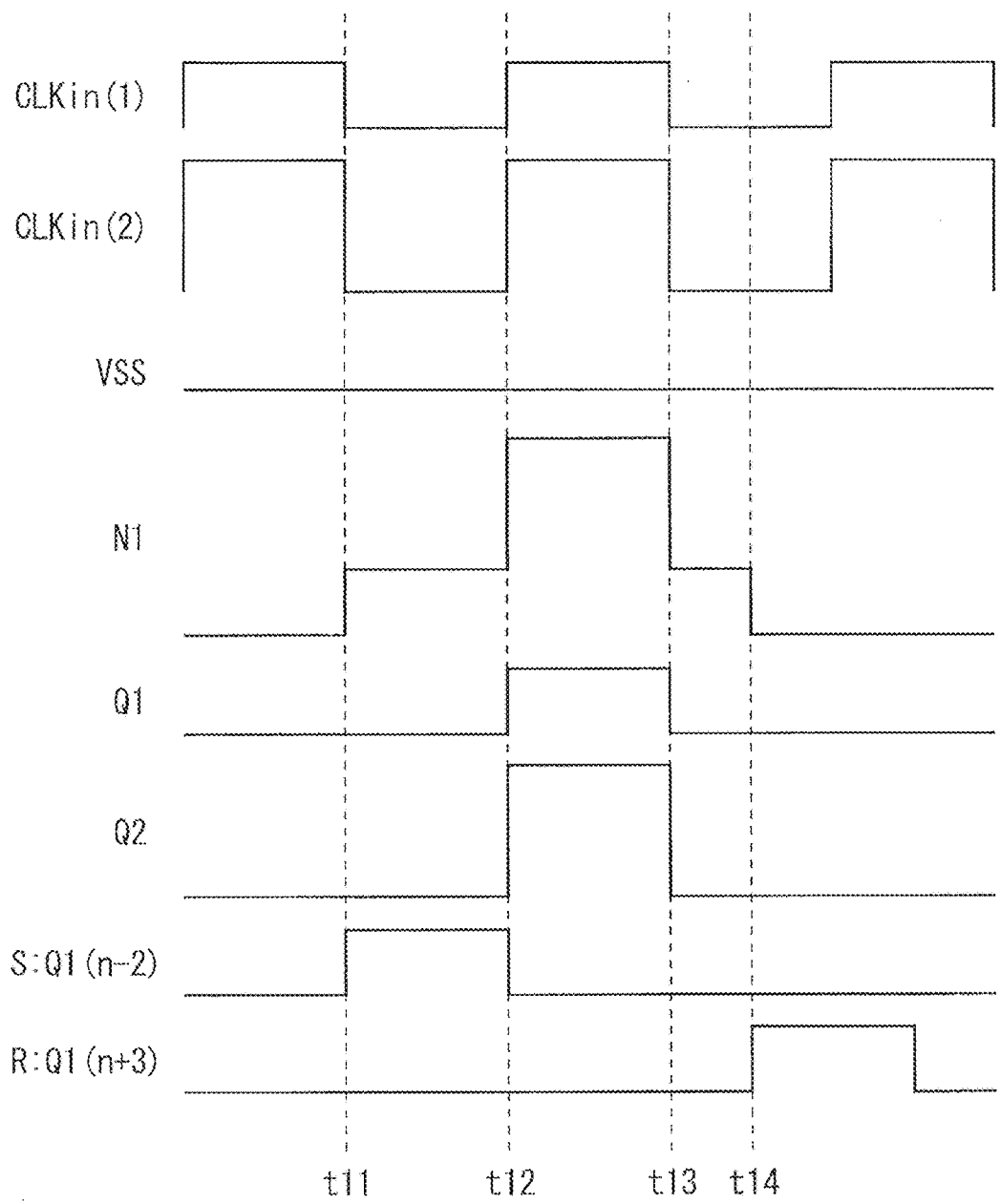
FIG. 10 is a signal waveform diagram illustrating the operation performed by the unit circuit according to the first embodiment.

As illustrated in FIG. 10, the amplitude of the second input clock signal CLKin(2) is greater than the amplitude of the first input clock signal CLKin(1). For this reason, during the period from time t12 to time t13, the potential of the second output signal Q2 is higher than the potential of the first output signal Q1.

At time t13, the first input clock signal CLKin(1) and the second input clock signal CLKin(2) change from high level to low level. As a result, the potential of the output terminal 28 decreases with decreasing potential of the input terminal 23, and the potential of the output terminal 29 decreases with decreasing potential of the input terminal 24. That is, the potential of the first output signal Q1 and the potential of the second output signal Q2 become a low level. Furthermore, the potential of the first control node N1 also decreases via the capacitor C1.

At time t14, the reset signal R changes from low level to high level. As a result, the thin-film transistor T2 is turned on, and the potential of the first control node N1 is at a low level. When the potential of the first control node N1 is at a low level, the thin-film transistors T3 and T4 are turned off.

The above-described operation is performed by all the unit circuits 2 that constitute the shift register 210 and, thus, the plurality of (i) gate bus lines GL(1) to GL(i) sequentially become a high level (active) for a predetermined period, as illustrated in FIG. 8.

1.4 Effect

According to the present embodiment, each of the unit circuits 2 that constitute the shift register 210 in the gate driver 200 outputs the first output signal Q1 serving as a control signal for controlling the operation of another unit circuit 2 and the second output signal Q2 serving as the scanning signal G given to the corresponding gate bus line GL. The first conduction terminal of the thin-film transistor T4 having a second conduction terminal connected to the output terminal 29 that outputs the second output signal Q2 is given a clock signal (the second input clock signal CLKin(2)) having a greater amplitude than the clock signal (the first input clock signal CLKin(1)) given to the first conduction terminal of the thin-film transistor T3 having a second conduction terminal connected to the output terminal 28 that outputs the first output signal Q1. Since the second input clock signal CLKin(2) is a high voltage signal that appropriately drives the electrophoretic element 41, a high voltage is applied between the first conduction terminal and the second conduction terminal (that is, between the drain and source) of the thin-film transistor T4. The channel length L2 of the thin-film transistor T4 is greater than the channel length L1 of the thin-film transistor T3 (refer to FIGS. 9A and 9B). That is, the breakdown voltage of the thin-film transistor T4 is higher than the breakdown voltage of the thin-film transistor T3 so that the element destruction and the characteristic deterioration of the thin-film transistor T4 are reduced. As described above, according to the present embodiment, an electrophoretic display device can be achieved that includes a gate driver (a monolithic gate driver) 200 capable of driving the gate bus line GL using a high voltage signal without causing element destruction and characteristic deterioration of the thin-film transistor in the unit circuit 2.

1.5 Modifications

According to the first embodiment described above, to increase the breakdown voltage of the thin-film transistor T4, a configuration is employed in which the channel length L2 of the thin-film transistor T4 is greater than the channel length L1 of the thin-film transistor T3 (refer to FIGS. 9A and 9B). However, a configuration for increasing the breakdown voltage of the thin-film transistor T4 is not limited thereto. A modification of the configuration for increasing the breakdown voltage of the thin-film transistor T4 is described below. According to a second embodiment and a third embodiment described below, the breakdown voltage of a thin-film transistor other than the thin-film transistor T4 can be also increased. The configuration described above in the first embodiment and configurations according to first to fifth modifications described below are also applicable to thin-film transistors other than the thin-film transistor T4.

1.5.1 First Modification

Figure 11:
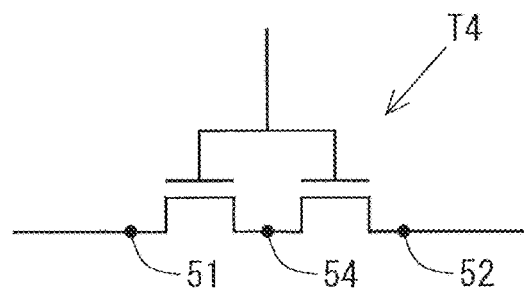
FIG. 11 illustrates the structure for increasing the breakdown voltage of a thin-film transistor according to a first modification of the first embodiment.
Figure 12:
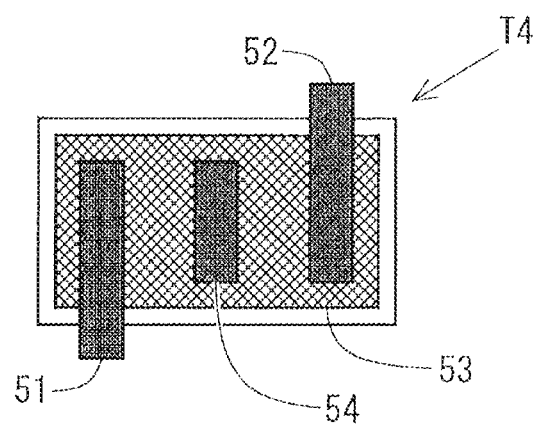
FIG. 12 illustrates the structure for increasing the breakdown voltage of a thin-film transistor according to the first modification of the first embodiment.

FIGS. 11 and 12 illustrate the structure of a thin-film transistor T4 according to the first modification of the first embodiment. In FIGS. 11 and 12, a region 54 corresponds to an $n^+$ type region. As illustrated in FIG. 11, the thin-film transistor T4 according to the present modification is composed of two thin-film transistors connected in series. Note that the thin-film transistor T3 is composed of one transistor. By employing the above-described configuration, the entire channel length of the thin-film transistor T4 is greater than the channel length of the thin-film transistor T3. Therefore, the breakdown voltage of the thin-film transistor T4 is higher than that of the thin-film transistor T3.

The thin-film transistor T4 may be composed of three or more thin-film transistors connected in series. Furthermore, in the example illustrated in FIG. 12, two thin-film transistors are integrated. However, a configuration in which two independent thin-film transistors are electrically equivalently arranged in series can also be employed. Alternatively, if the thin-film transistor T3 is composed of P thin-film transistors connected in series (where P is an integer greater than or equal to 2), the thin-film transistor T4 may be composed of Q thin-film transistors connected in series (where Q is an integer greater than P).

1.5.2 Second Modification

Figure 13:
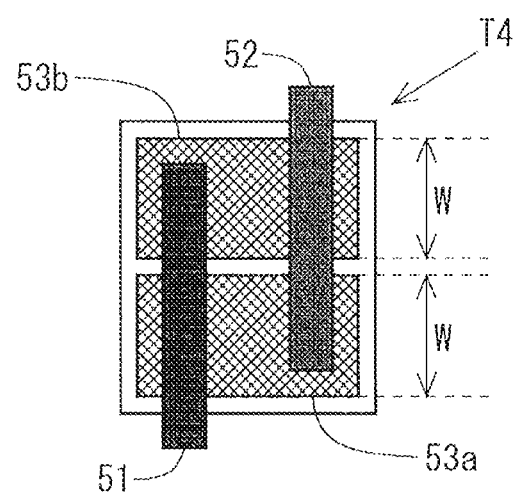
FIG. 13 illustrates the structure for increasing the breakdown voltage of a thin-film transistor according to a second modification of the first embodiment.

FIG. 13 illustrates the structure of a thin-film transistor T4 according to the second modification of the first embodiment. According to the present modification, as illustrated in FIG. 13, the semiconductor layer of the thin-film transistor T4 is divided into portions 53a and 53b. The channel width (the unit channel width) W corresponding to each of the divided portions of the semiconductor layer is less than or equal to the channel width of the thin-film transistor T3. Although an example in which the semiconductor layer is divided into two is described here, the semiconductor layer may be divided into three or more. As described above, according to the present modification, the thin-film transistor T4 has a plurality of divided portions of the semiconductor layer, and the channel width of the thin-film transistor T4 in each of the plurality of divided portions of the semiconductor layer is less than or equal to the channel width of the thin-film transistor T3. Even when such a configuration is employed, the breakdown voltage of the thin-film transistor T4 is higher than that of the thin-film transistor T3.

In the example illustrated in FIG. 13, two thin-film transistors are integrated. However, a configuration in which two independent thin-film transistors are arranged electrically equivalently in parallel can also be employed. Furthermore, if the thin-film transistor T3 has a special structure, the semiconductor layer of the thin-film transistor T4 may be divided such that the unit channel width of the thin-film transistor T4 is less than or equal to the unit channel width of the thin-film transistor T3.

1.5.3 Third Modification

Figure 14:
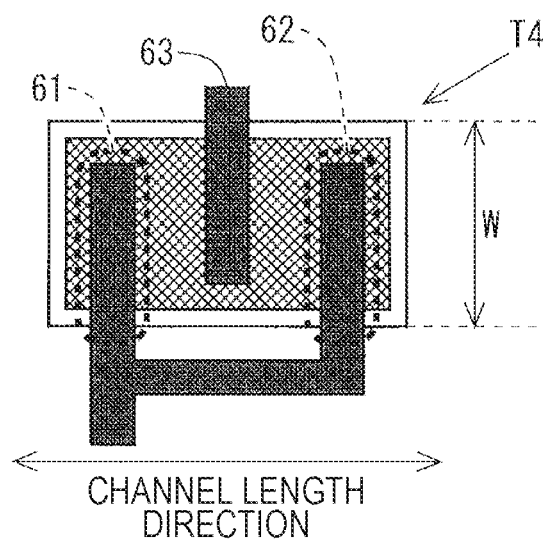
FIG. 14 illustrates the structure for increasing the breakdown voltage of a thin-film transistor according to a third modification of the first embodiment.

FIG. 14 illustrates the structure of a thin-film transistor T4 according to the third modification of the first embodiment. According to the present modification, as illustrated in FIG. 14, one of the first conduction terminal and the second conduction terminal of the thin-film transistor T4 includes a first electrode portion 61 provided at one end in the channel length direction of the thin-film transistor T4 and a second electrode portion 62 provided on the other end in the channel length direction of the thin-film transistor T4 and electrically connected to the first electrode portion 61. The other of the first conduction terminal and second conduction terminal of the thin-film transistor T4 includes a third electrode portion 63 provided between the first electrode portion 61 and the second electrode portion 62 so that a channel is formed between the third electrode portion 63 and the first electrode portion 61 and between the third electrode portion 63 and the second electrode portion 62. The unit channel width of the thin-film transistor T4 is less than or equal to the unit channel width of the thin-film transistor T3. Even when the above-described configuration is employed, the breakdown voltage of the thin-film transistor T4 is higher than that of the thin-film transistor T3.

In the example illustrated in FIG. 14, two thin-film transistors are integrated. However, a configuration in which two independent thin-film transistors are arranged electrically equivalently in parallel can also be employed.

1.5.4 Fourth Modification

Figure 15:
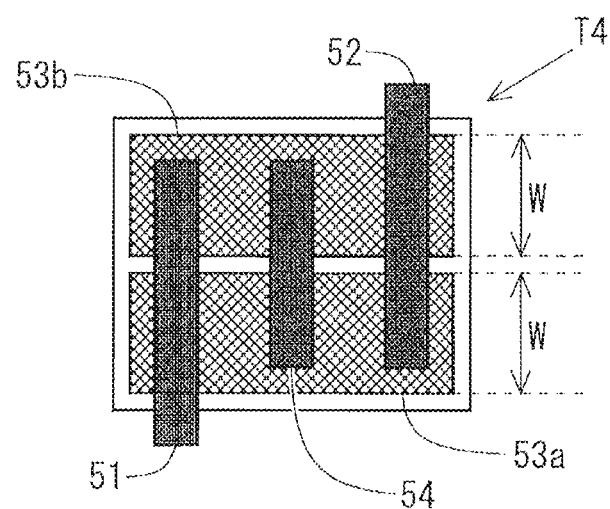
FIG. 15 illustrates the structure for increasing the breakdown voltage of a thin-film transistor according to a fourth modification of the first embodiment.

FIG. 15 illustrates the structure of a thin-film transistor T4 according to the fourth modification of the first embodiment. The thin-film transistor T4 according to the present modification has a configuration obtained by combining the configuration of the first modification (refer to FIG. 12) with the configuration of the second modification (refer to FIG. 13). That is, as illustrated in FIG. 15, the thin-film transistor T4 is composed of two thin-film transistors connected in series, and the semiconductor layer of the thin-film transistor T4 is divided into portions 53a and 53b. The channel width (the unit channel width) W corresponding to each of the divided portions of the semiconductor layer is less than or equal to the channel width of the thin-film transistor T3. Even when such a configuration is employed, the breakdown voltage of the thin-film transistor T4 is higher than that of the thin-film transistor T3.

1.5.5 Fifth Modification

Figure 16:
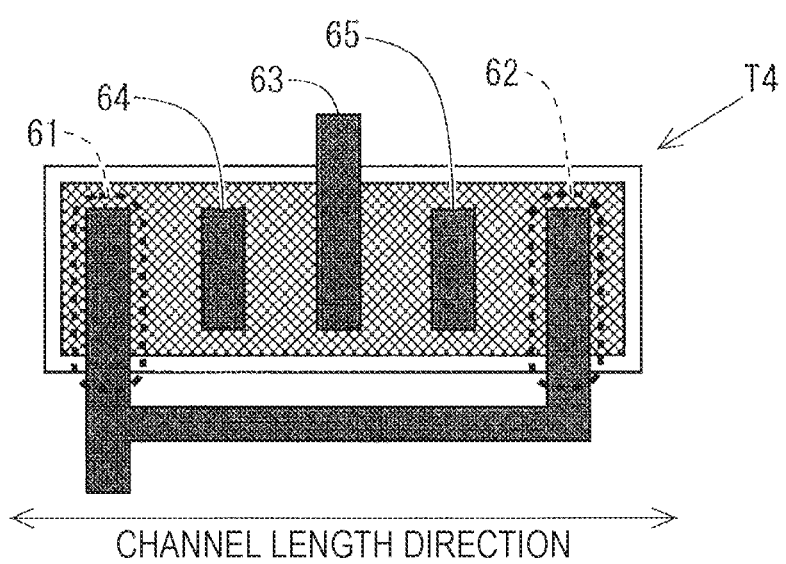
FIG. 16 illustrates the structure for increasing the breakdown voltage of a thin-film transistor according to a fifth modification of the first embodiment.

FIG. 16 illustrates the structure of a thin-film transistor T4 according to the fifth modification of the first embodiment. The thin-film transistor T4 according to the present modification has a configuration obtained by combining the above-described configuration of the first modification (refer to FIG. 12) with the above-described configuration of the third modification (refer to FIG. 14). More precisely, as illustrated in FIG. 16, one of the first conduction terminal and the second conduction terminal of the thin-film transistor T4 includes the first electrode portion 61 provided at one end in the channel length direction of the thin-film transistor T4 and the second electrode portion 62 provided at the other end in the channel length direction of the thin-film transistor T4 and electrically connected to the first electrode portion 61. The other of the first conduction terminal and the second conduction terminal of the thin-film transistor T4 includes the third electrode portion 63 provided between the first electrode portion 61 and the second electrode portion 62 so that two channels that sandwich an $N^+$ type region 64 are formed between the third electrode portion 63 and the first electrode portion 61, and two channels that sandwich an $N^+$ type region 65 are formed between the third electrode portion 63 and the second electrode portion 62. A portion between the first electrode portion 61 and the third electrode portion 63 consists of two thin-film transistors connected in series, and a portion between the second electrode portion 62 and the third electrode portion 63 also consists of two thin-film transistors connected in series. Even when the above-described configuration is employed, the breakdown voltage of the thin-film transistor T4 is higher than that of the thin-film transistor T3.

1.5.6 Other Modifications

According to the fourth modification, the configuration in which the configuration of the first modification and the configuration of the second modification are combined is employed. According to the fifth modification, the configuration in which the configuration of the first modification and the configuration of the third modification are combined is employed. However, configurations related to combinations other than the above-described combinations may also be employed if the breakdown voltage of the thin-film transistor T4 is higher than the breakdown voltage of the thin-film transistor T3.

2. Second Embodiment

An active matrix electrophoretic display device (electronic paper) according to the second embodiment is described below. The overall configuration (refer to FIG. 2), the configuration of an electrophoretic element 41 (refer to FIGS. 3A and 3B), the schematic configuration of a gate driver 200 (refer to FIG. 4), the configuration of a shift register (refer to FIG. 6), and the operation performed by the gate driver 200 (refer to FIG. 8), the configuration of a unit circuit (refer to FIG. 1), and the operation performed by the unit circuit (refer to FIG. 10) are the same as those according to the first embodiment, and descriptions thereof are not repeated.

2.1 Breakdown Voltage of Thin-Film Transistor

In each of the unit circuits 2, the potential of the first control node N1 increases prominently during the selection operation period. Therefore, a relatively high voltage is applied between the drain and source (between the first conduction terminal and the second conduction terminal) of the thin-film transistor T1 during a period of the selection operation period during which the thin-film transistor T1 is turned off. For the same reason, a relatively high voltage is applied between the drain and source (between the first conduction terminal and the second conduction terminal) of the thin-film transistor T2 during the selection operation period. Therefore, according to the present embodiment, in addition to the breakdown voltage of the thin-film transistor T4, the breakdown voltages of the thin-film transistor T1 and the thin-film transistor T2 are increased.

More specifically, the channel length of each of the thin-film transistor T1 and thin-film transistor T2 is greater than the channel length of thin-film transistor T3. However, the channel length of each of the thin-film transistor T1 and the thin-film transistor T2 is less than or equal to the channel length of the thin-film transistor T4. For example, the channel length of the thin-film transistor T3 is 6 μm, the channel length of each of the thin-film transistor T1 and the thin-film transistor T2 is 9 μm, and the channel length of the thin-film transistor T4 is 12 μm.

As described above, according to the present embodiment, the breakdown voltage of each of the thin-film transistor T1 and the thin-film transistor T2 is higher than the breakdown voltage of the thin-film transistor T3 and lower than or equal to the breakdown voltage of the thin-film transistor T4. As described above, the breakdown voltage of the thin-film transistor having a first conduction terminal or second conduction terminal connected to the first control node N1 is higher than the breakdown voltage of the thin-film transistor T3 and lower than or equal to the breakdown voltage of the thin-film transistor T4.

2.2 Effect

According to the present embodiment, in terms of the circuit elements included in each of the unit circuits 2 that constitute the shift register 210 in the gate driver 200, the breakdown voltage is increased for the thin-film transistor T1 and the thin-film transistor T2 as well as the thin-film transistor T4. As a result, in an electrophoretic display device including a gate driver (a monolithic gate driver) 200 that drives a gate bus line GL using a high voltage signal, the element destruction and the characteristic deterioration of the thin-film transistor included in each of the unit circuits 2 that constitute the shift register 210 in the gate driver 200 can be more effectively reduced.

2.3 Modification

According to the above-described second embodiment, the channel length of each of the thin-film transistors T1 and T2 is set to be greater than the channel length of the thin-film transistor T3 and, thus, the breakdown voltages of thin-film transistors T1 and T2 are set to be higher than the breakdown voltage of the thin-film transistor T3. However, the present disclosure is not limited thereto. In the same manner as in the above-described first to fifth modifications of the first embodiment, the breakdown voltage of each of the thin-film transistor T1 and the thin-film transistor T2 can be higher than the breakdown voltage of the thin-film transistor T3.

In the case where the above-described first modification of the first embodiment is applied to the structures of the thin-film transistor T1 and the thin-film transistor T2, if the thin-film transistor T3 is composed of one transistor, each of the thin-film transistor T1 and the thin-film transistor T2 is composed of a plurality of transistors connected in series. In the case where the above-described first modification of the first embodiment is applied to the structures of the thin-film transistor T1 and the thin-film transistor T2, if the thin-film transistor T3 is composed of P transistors connected in series (where P is an integer greater than or equal to 2), the thin-film transistor T1 is composed of Qa transistors connected in series (where Qa is an integer greater than P), and the thin-film transistor T2 is composed of Qb transistors connected in series (where Qb is an integer greater than P).

In the case where the second modification of the first embodiment is applied to the structures of the thin-film transistor T1 and the thin-film transistor T2, the thin-film transistor T1 has a semiconductor layer divided into a plurality of portions, and the channel width of the thin-film transistor T1 in each of the divided portions of the semiconductor layer is less than or equal to the channel width of the thin-film transistor T3, and the thin-film transistor T2 has a semiconductor layer divided into a plurality of portions, and the channel width of the thin-film transistor T2 in each of the divided portions of the semiconductor layer is less than or equal to the channel width of the thin-film transistor T3.

In the case where the above-described third modification of the first embodiment is applied to the structures of the thin-film transistor T1 and the thin-film transistor T2, the structures are as follows. One of the first conduction terminal and the second conduction terminal of the thin-film transistor T1 includes a first electrode portion provided at one end in the channel length direction of the thin-film transistor T1 and a second electrode portion provided at the other end in the channel length direction of the thin-film transistor T1 and electrically connected to the first electrode portion. The other of the first conduction terminal and the second conduction terminal of the thin-film transistor T1 includes a third electrode portion provided between the first electrode portion and the second electrode portion so that a channel is formed between the third electrode portion and the first electrode portion and between the third electrode portion and the second electrode portion. One of the first conduction terminal and the second conduction terminal of the thin-film transistor T2 includes a fourth electrode portion provided at one end in the channel length direction of the thin-film transistor T2 and a fifth electrode portion provided at the other end in the channel length direction of the thin-film transistor T2 and electrically connected to the fourth electrode portion. The other of the first conduction terminal and the second conduction terminal of the thin-film transistor T2 includes a sixth electrode portion provided between the fourth electrode portion and the fifth electrode portion so that a channel is formed between the sixth electrode portion and the fourth electrode portion and between the sixth electrode portion and the fifth electrode portion.

3. Third Embodiment

An active matrix electrophoretic display device (electronic paper) according to the third embodiment is described below. The overall configuration (refer to FIG. 2), the configuration of an electrophoretic element 41 (refer to FIGS. 3A and 3B), and the schematic configuration of a gate driver 200 (refer to FIG. 4) are the same as those of the first embodiment, and descriptions thereof are not repeated.

3.1 Shift Register Configuration

Figure 17:
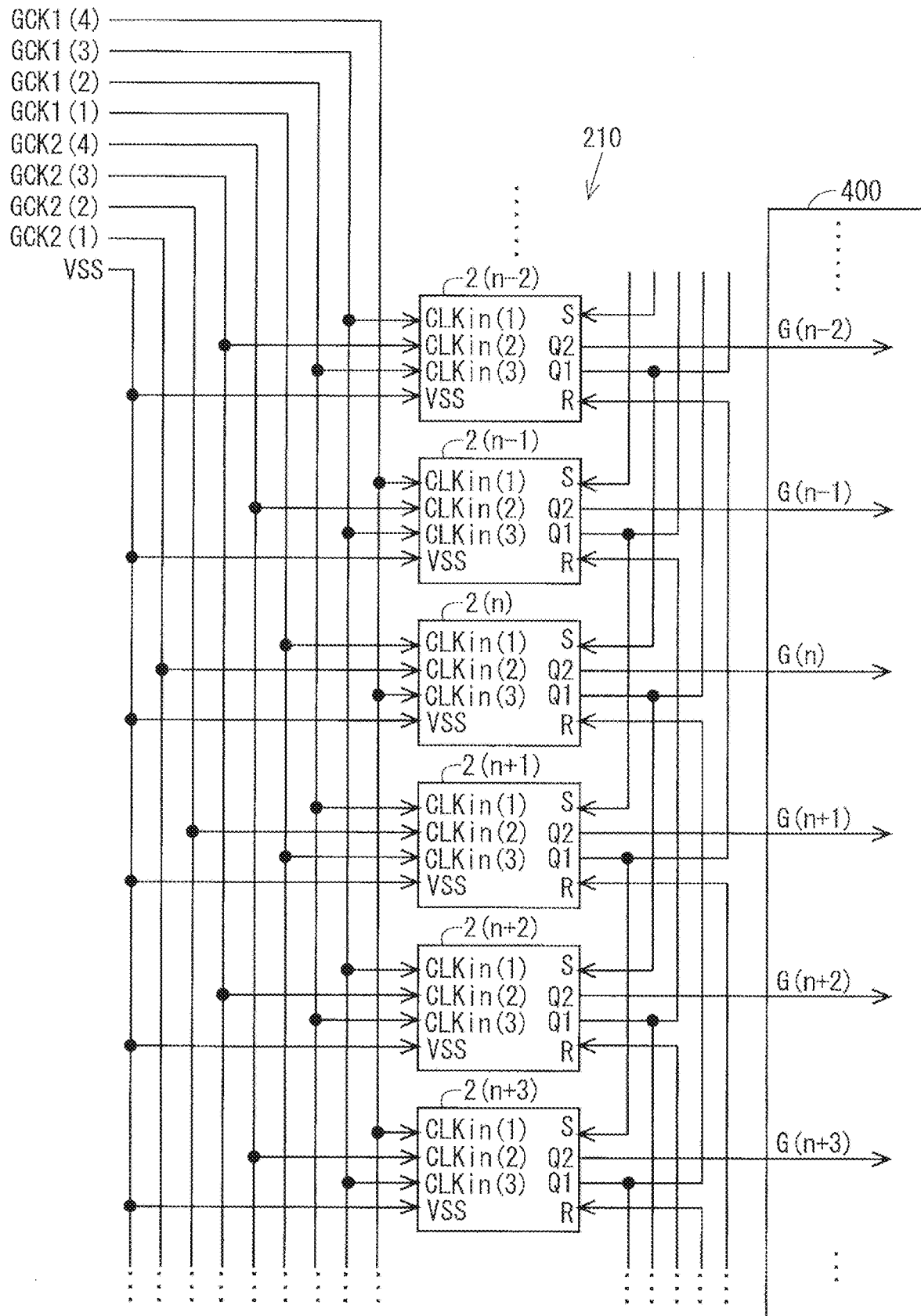
FIG. 17 is a block diagram of the configuration of a shift register according to a third embodiment.

FIG. 17 is a block diagram of the configuration of a shift register 210 according to the present embodiment. According to the first embodiment described above, each of the unit circuits 2 is given one of the four-phase first clock signals GCK1(1) to GCK1(4) as the first input clock signal CLKin(1) and is given one of the four-phase second clock signals GCK2(1) to GCK2(4) as the second input clock signal CLKin(2). In contrast, according to the present embodiment, as a third input clock signal CLKin(3), each of the unit circuit 2 is further given, among the four-phase first clock signals GCK1(1) to GCK1(4), a first input clock signal other than the first clock signal given as the first clock signal CLKin(1). At this time, according to the present embodiment, each of the unit circuits 2 is given, as a third input clock signal CLKin(3), a first clock signal having a phase that is 90 degrees ahead of the phase of the first clock signal given as the first input clock signal CLKin(1).

3.2 Configuration of Unit Circuit

Figure 18:
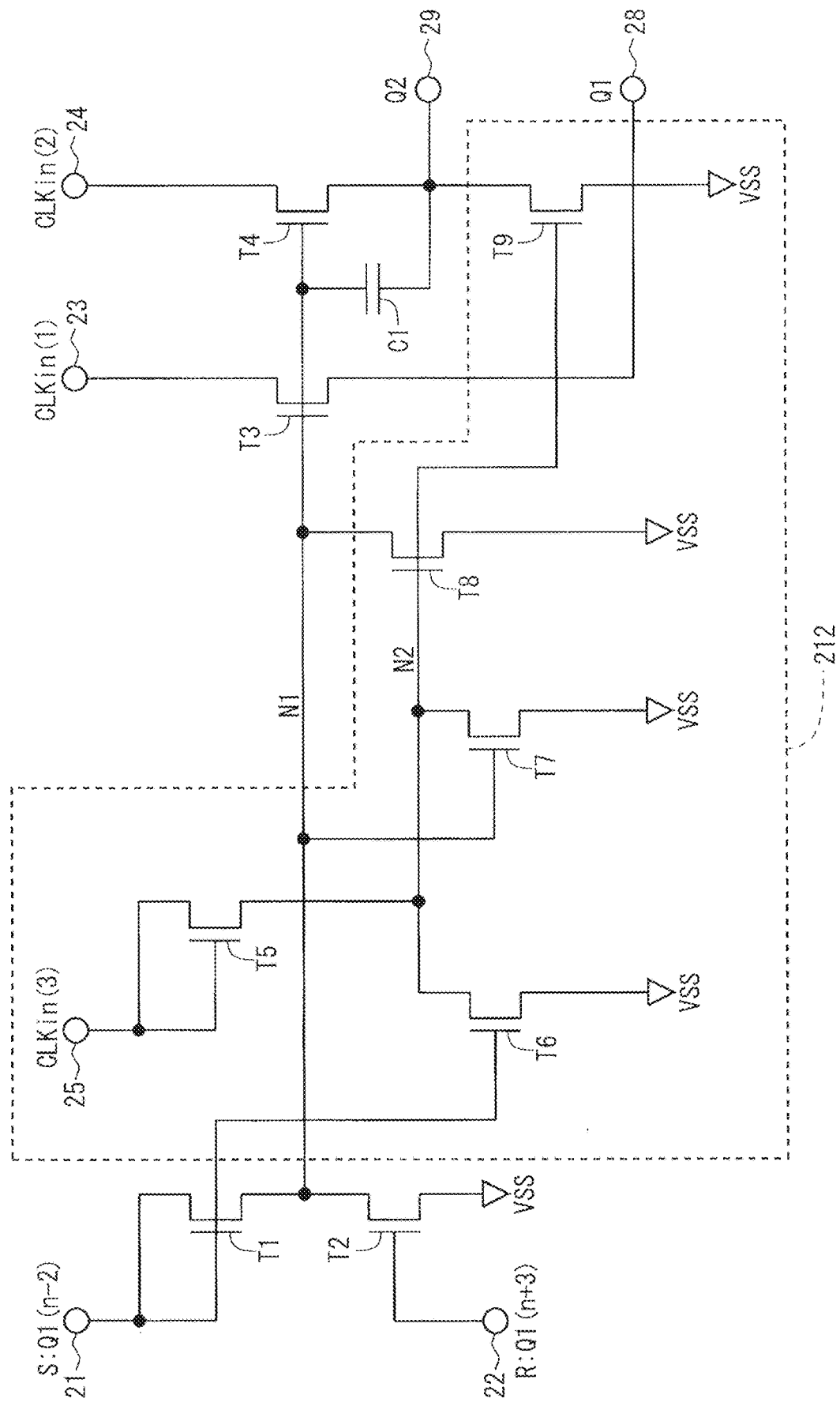
FIG. 18 is a circuit diagram of the configuration of a unit circuit (the configuration for one stage of a shift register) according to the third embodiment.

FIG. 18 is a circuit diagram of the configuration of the unit circuit 2 (the configuration for one stage of the shift register 210) according to the present modification. As can be seen from a comparison of FIG. 1 and FIG. 18, the unit circuit 2 according to the present embodiment includes five thin-film transistors T5 to T9 and one input terminal 25 in addition to the constituent elements of the above-described embodiment. The circuit including the five thin-film transistors T5 to T9 and one input terminal 25 achieves a stabilizing circuit 212 that ensures the potential of the first control node N1 and the potential of the output terminal 29 (the potential of the second output signal Q2) to be maintained at a low level during the normal operation period. As used herein, a node connected to the control terminal of the thin-film transistor T8 and the control terminal of the thin-film transistor T9 is referred to as a "second control node", and the second control node is generally identified by reference numeral N2. The input terminal 25 is given the third input clock signal CLKin(3) described above.

The control terminal and the first conduction terminal of the thin-film transistor T5 are connected to the input terminal 25 (that is, diode connected), and the second conduction terminal is connected to the second control node N2. The control terminal of the thin-film transistor T6 is connected to the input terminal 21, the first conduction terminal is connected to the second control node N2, and the second conduction terminal is connected to the input terminal for the low-level DC power supply voltage VSS. A control terminal of the thin-film transistor T7 is connected to the first control node N1, a first conduction terminal is connected to the second control node N2, and the second conduction terminal is connected to the input terminal for the low-level DC power supply voltage VSS. A control terminal of the thin-film transistor T8 is connected to the second control node N2, a first conduction terminal is connected to the first control node N1, and a second conduction terminal is connected to the input terminal for the low-level DC power supply voltage VSS. A control terminal of the thin-film transistor T9 is connected to the second control node N2, a first conduction terminal is connected to the output terminal 29, and the second conduction terminal is connected to the input terminal for the low-level DC power supply voltage VSS.

According to the present embodiment, the thin-film transistor T5 achieves a second control node turn-on transistor, the thin-film transistor T6 achieves a first second control node turn-off transistor, and the thin-film transistor T7 achieves a second second control node turn-off transistor. The thin-film transistor T8 achieves a first control node turn-off transistor, and the thin-film transistor T9 achieves a second output node turn-off transistor.

3.3 Breakdown Voltage of Thin-Film Transistor

According to the present embodiment, a relatively high voltage is applied between the drain and source (between the first conduction terminal and the second conduction terminal) of each of the thin-film transistor T1, thin-film transistor T2, thin-film transistor T8, and thin-film transistor T9 during the selection operation period. Therefore, according to the present embodiment, the breakdown voltage is increased for the thin-film transistor T1, the thin-film transistor T2, the thin-film transistor T8, and the thin-film transistor T9, in addition to the thin-film transistor T4.

More specifically, the channel length of each of the thin-film transistors T1, T2, T8, and T9 is greater than the channel length of thin-film transistor T3. However, the channel length of each of the thin-film transistors T1, T2, T8, and T9 is less than or equal to the channel length of thin-film transistor T4.

As described above, according to the present embodiment, the breakdown voltages of each of the thin-film transistors T1, T2, T8, and T9 is higher than the breakdown voltage of the thin-film transistor T3 and is lower than or equal to the breakdown voltage of the thin-film transistor T4.

Specific configurations (structures) for increasing the breakdown voltage of the thin-film transistors T1, T2, T8, and T9 include the configuration according to the first embodiment and the configurations according to the first to fifth modifications of the first embodiment described above.

3.4 Operation Performed by Unit Circuit

Figure 19:
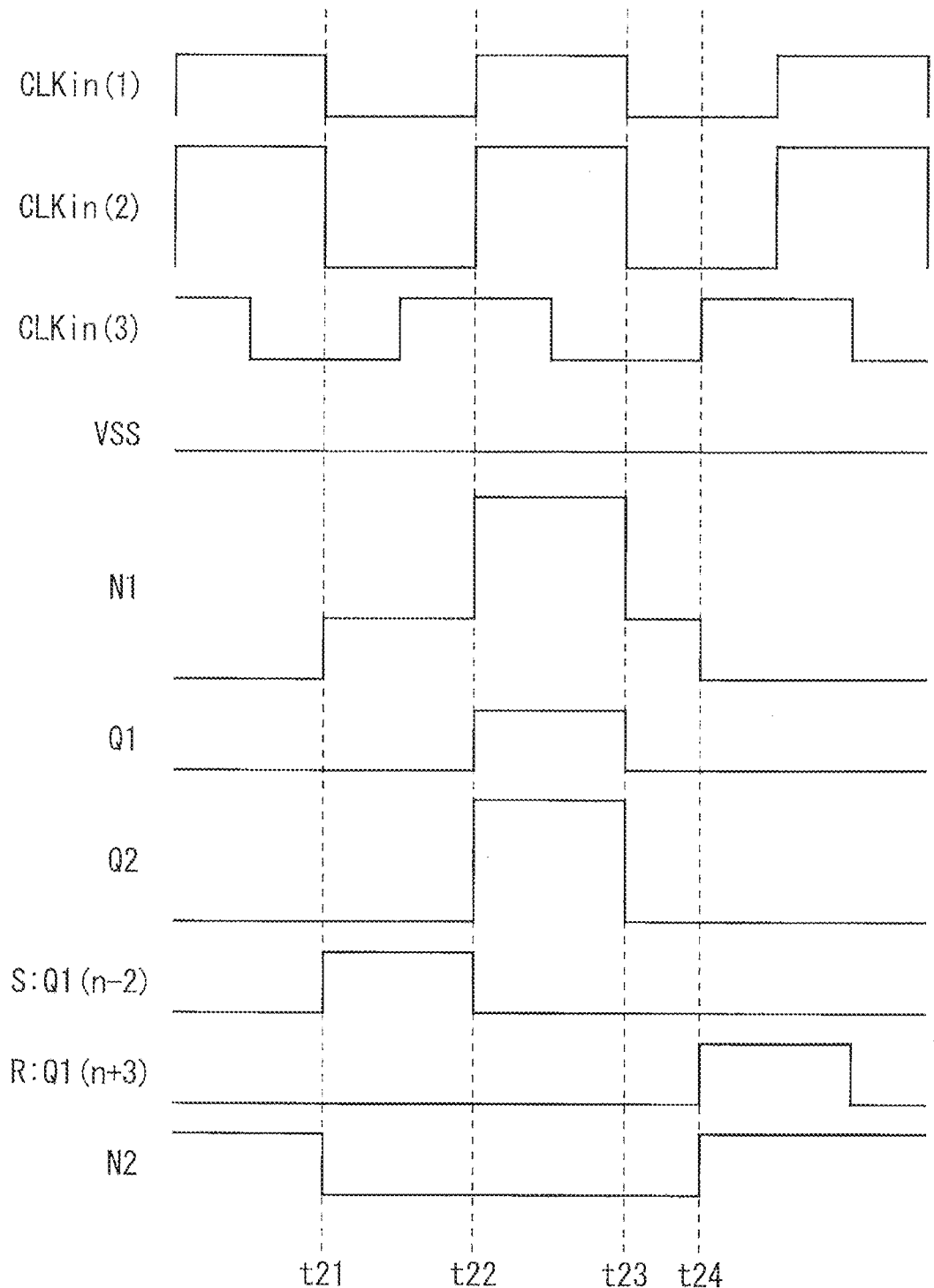
FIG. 19 is a signal waveform diagram illustrating the operation performed by the unit circuit according to the third embodiment.
Figure 20:
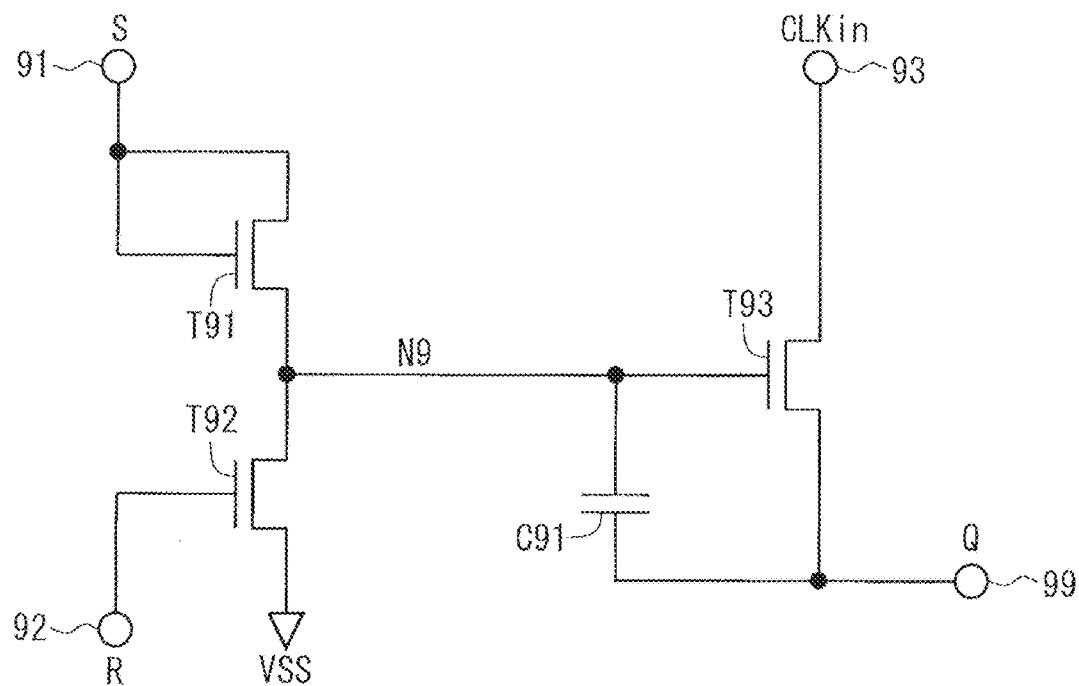
FIG. 20 is a circuit diagram of a configuration example of an existing unit circuit.
Figure 21:
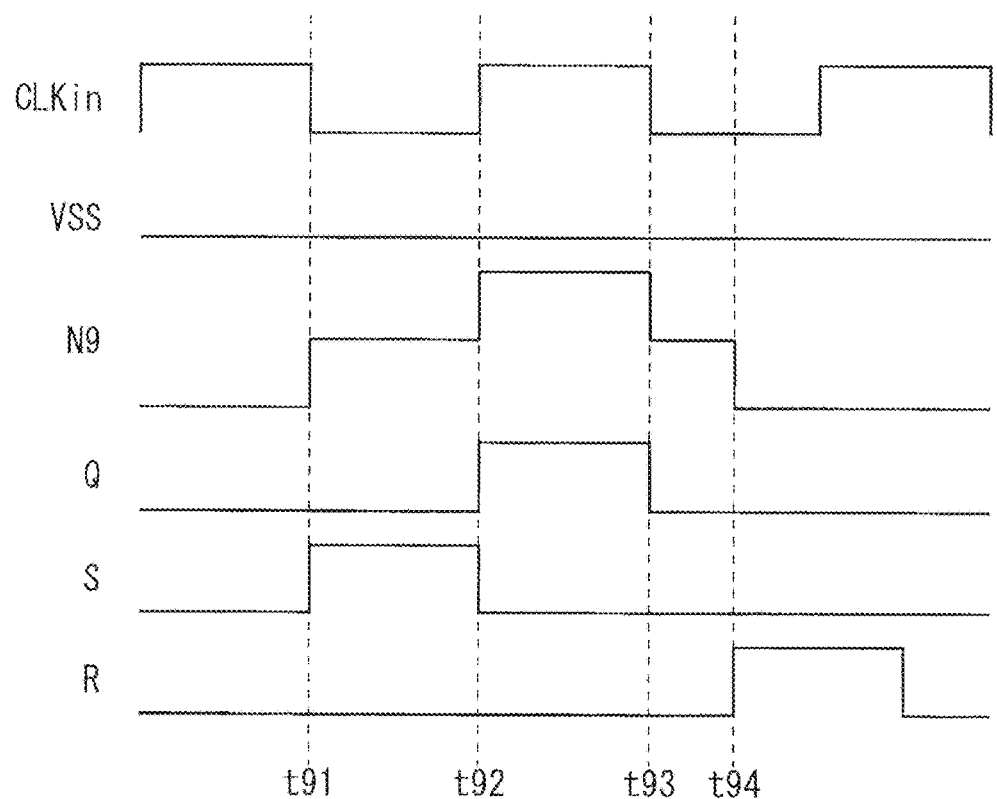
FIG. 21 is a signal waveform diagram illustrating the operation performed by an existing unit circuit.

The operation performed by the unit circuit 2 according to the present embodiment is described with reference to FIG. 19. In the present example, the period before time t21 and the period after time t24 are the normal operation period, and the period from time t21 to time t24 is the selection operation period.

In the period before time t21, the potential of the first control node N1, the potential of the first output signal Q1 (the potential of the output terminal 28), and the potential of the second output signal Q2 (the potential of the output terminal 29) are at a low level (an off level). The potential of the second control node N2 is at a high level.

At time t21, the set signal S changes from low level (off level) to high level (on level). This turns on the thin-film transistor T1 and the thin-film transistor T6. When the thin-film transistor T6 is turned on, the potential of the second control node N2 becomes low level, and the thin-film transistor T8 and the thin-film transistor T9 are turned off. Furthermore, since the thin-film transistor T1 is turned on, the potential of the first control node N1 changes from low level to high level, as in the operation performed at time t11 according to the first embodiment (refer to FIG. 10). As a result, the thin-film transistor T3, thin-film transistor T4, and thin-film transistor T7 are turned on. Since the thin-film transistor T7 is turned on, the potential of the second control node N2 is set to the VSS potential. Although the thin-film transistor T3 and the thin-film transistor T4 are turned on, the first input clock signal CLKin(1) and the second input clock signal CLKin(2) are maintained at a low level during the period from time t21 to time t22. As a result, during the period, the first output signal Q1 and the second output signal Q2 are maintained at a low level.

At time t22, the set signal S changes from high level to low level. As a result, the thin-film transistors T1 and T6 are turned off. Furthermore, at time t22, the first input clock signal CLKin(1) and the second input clock signal CLKin(2) change from low level to high level. As a result, as in the operation performed at time t12 according to the first embodiment, the potential of the first output signal Q1 (the potential of the output terminal 28) and the potential of the second output signal Q2 (the potential of the output terminal 29) increase. At this time, the potential of the second output signal Q2 is higher than the potential of the first output signal Q1.

At time t23, the first input clock signal CLKin(1) and the second input clock signal CLKin(2) change from high level to low level. As a result, as in the operation performed at time t13 according to the first embodiment, the potential of the first output signal Q1 and the potential of the second output signal Q2 become low level, and the potential of the first control node N1 also decreases.

At time t24, the reset signal R changes from low level to high level. As a result, the thin-film transistor T2 is turned on, and the potential of the first control node N1 becomes low level. Since the potential of the first control node N1 becomes low level, the thin-film transistors T3, T4, and T7 are turned off. Furthermore, at time t24, the third input clock signal CLKin(3) changes from low level to high level. As illustrated in FIG. 18, the thin-film transistor T5 is diode connected. Thus, when the third input clock signal CLKin(3) changes to high level, the thin-film transistor T5 is turned on, and the potential of the second control node N2 changes from low level to high level. This turns on the thin-film transistor T8 and the thin-film transistor T9. Since the thin-film transistor T8 and the thin-film transistor T9 turn on in this manner, the potentials of the first control node N1 and the output terminal 29 are set to the VSS potential even if noise mixes into the first control node N1 or the output terminal 29 during the normal operation period.

3.5 Effect

According to the present embodiment, the stabilizing circuit 212 is provided in each of the unit circuits 2 that constitute the shift register 210 in the gate driver 200 to reliably maintain the potential of the first control node N1 and the potential of the output terminal 29 (the potential of the second output signal Q2) at a low level during the normal operation period. As a result, the occurrence of abnormal operation caused by noise entering the first control node N1 or the output terminal 29 during the normal operation period is reduced. Furthermore, in the circuit element included in each of the unit circuits 2 that constitute the shift register 210 in the gate driver 200, the breakdown voltages of the thin-film transistors T1, T2, T8, and T9 are increased in addition to the thin-film transistor T4. As described above, in an electrophoretic display device including the gate driver (monolithic gate driver) 200 that drives a gate bus line GL using a high voltage signal, it is possible to effectively reduce the element destruction, the characteristic deterioration, and an abnormal operation caused by noise of the thin-film transistor included in each of the unit circuits 2 that constitute the shift register 210 in the gate driver 200.

4. Others

While the present disclosure has been described in detail above, the above description is illustrative in all respects and is not restrictive. It is to be understood that numerous other changes and modifications can be made without departing from the scope of the disclosure.

The present disclosure contains subject matter related to that disclosed in Japanese Priority Patent Application JP 2023-011531 filed in the Japan Patent Office on Jan. 30, 2023, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
 a scanning signal line drive circuit configured to drive a plurality of scanning signal lines, each connected to a plurality of pixel forming portions,
 wherein the scanning signal line drive circuit includes a shift register having a plurality of stages corresponding to the plurality of scanning signal lines on a one-to-one basis and configured to operate based on a plurality of first clock signals and a plurality of second clock signals, each of the plurality of second clock signals having an amplitude that is greater than an amplitude of each of the plurality of first clock signals,
 wherein a first unit circuit, among a plurality of unit circuits, that forms one of the plurality of stages included in the shift register includes;
  a first output node configured to output a control signal for controlling an operation performed by a second unit circuit of the plurality of unit circuits,
  a second output node configured to output a scanning signal to a corresponding one of the plurality of scanning signal lines,
  a first control node configured to change from an off level to an on level based on a control signal output from a first output node of a third unit circuit of the plurality of unit circuits that forms a preceding stage,
  a first output control transistor including a control terminal connected to the first control node, a first conduction terminal to which a corresponding one of the plurality of first clock signals is given, and a second conduction terminal connected to the first output node, and
  a second output control transistor including a control terminal connected to the first control node, a first conduction terminal to which a corresponding one of the plurality of second clock signals is given, and a second conduction terminal connected to the second output node,
 wherein a breakdown voltage of the second output control transistor is higher than a breakdown voltage of the first output control transistor, and
 wherein a channel length of the second output control transistor is greater than a channel length of the first output control transistor.

2. The display device according to claim 1, wherein the first unit circuit further includes;
 a set transistor, wherein the set transistor includes a control terminal and a first conduction terminal that are connected to the first output node of the third unit circuit that forms the preceding stage, and a second conduction terminal that is connected to the first control node,
 a reset transistor, wherein the reset transistor includes a control terminal that is connected to a first output node of a fourth unit circuit of the plurality of unit circuits that forms a succeeding stage, a first conduction terminal that is connected to the first control node, and a second conduction terminal to which an off level potential is given, and
 a capacitor having one end connected to the first control node and another end connected to the second output node, and
 wherein a breakdown voltage of each of the set transistor and the reset transistor is higher than the breakdown voltage of the first output control transistor and is lower than or equal to the breakdown voltage of the second output control transistor.

3. The display device according to claim 2, wherein a channel length of each of the set transistor and the reset transistor is greater than the channel length of the first output control transistor and is less than or equal to the channel length of the second output control transistor.

4. The display device according to claim 2, wherein the first output control transistor is composed of one transistor, and wherein each of the set transistor and the reset transistor is composed of a plurality of transistors connected to in series.

5. The display device according to claim 2, wherein the first output control transistor is composed of P transistors connected in series, where P is an integer greater than or equal to 2,
wherein the set transistor is composed of Qa transistors connected in series, where Qa is an integer greater than P, and
wherein the reset transistor is composed of Qb transistors connected in series, where Qb is an integer greater than P.

6. The display device according to claim 2, wherein the set transistor further includes a semiconductor layer divided into a plurality of portions,
wherein a channel width of the set transistor in each of the plurality of divided portions of the semiconductor layer is less than or equal to a channel width of the first output control transistor,
wherein the reset transistor further includes a semiconductor layer divided into a plurality of portions, and
wherein a channel width of the reset transistor in each of the plurality of divided portions of the semiconductor layer is less than or equal to the channel width of the first output control transistor.

7. The display device according to claim 2, wherein one of the first conduction terminal and the second conduction terminal of the set transistor includes a first electrode portion provided at one end in a channel length direction of the set transistor and a second electrode portion provided at another end in the channel length direction of the set transistor and electrically connected to the first electrode portion,
wherein another one of the first conduction terminal and the second conduction terminal of the set transistor includes a third electrode portion provided between the first electrode portion and the second electrode portion so that a channel is formed between the third electrode portion and the first electrode portion and between the third electrode portion and the second electrode portion,
wherein one of the first conduction terminal and the second conduction terminal of the reset transistor includes a fourth electrode portion provided at one end in a channel length direction of the reset transistor and a fifth electrode portion provided at another end in the channel length direction of the reset transistor and electrically connected to the fourth electrode portion, and
wherein another one of the first conduction terminal and the second conduction terminal of the reset transistor includes a sixth electrode portion provided between the fourth electrode portion and the fifth electrode portion so that a channel is formed between the sixth electrode portion and the fourth electrode portion and between the sixth electrode portion and the fifth electrode portion.

8. The display device according to claim 2, wherein the first unit circuit further includes:
a second control node,
a second control node turn-on transistor including a control terminal and a first conduction terminal, wherein, among the plurality of first clock signals, a first clock signal other than the corresponding one of the plurality first clock signals given to the first conduction terminal of the first output control transistor is given to the control terminal and the first conduction terminal, and a second conduction terminal connected to the second control node,
a second control node turn-off transistor including a control terminal connected to the first output node of the third unit circuit that forms the preceding stage, a first conduction terminal connected to the second control node, and a second conduction terminal to which an off-level potential is given,
another second control node turn-off transistor including a control terminal connected to the first control node, a first conduction terminal connected to the second control node, and a second conduction terminal to which an off-level potential is given,
a first control node turn-off transistor including a control terminal connected to the second control node, a first conduction terminal connected to the first control node, and a second conduction terminal to which an off-level potential is given, and
a second output node turn-off transistor including a control terminal connected to the second control node, a first conduction terminal connected to the second output node, and a second conduction terminal to which an off-level potential is given, and
wherein a breakdown voltage of each of the first control node turn-off transistor and the second output node turn-off transistor is higher than the breakdown voltage of the first output control transistor and is lower than or equal to the breakdown voltage of the second output control transistor.

9. The display device according to claim 1, wherein the first unit circuit further includes a plurality of transistors in addition to the first output control transistor and the second output control transistor, and
wherein, among the plurality of transistors, a transistor having one of a first conduction terminal and a second conduction terminal connected to the first control node has a breakdown voltage that is higher than the breakdown voltage of the first output control transistor and is lower than or equal to the breakdown voltage of the second output control transistor.

10. The display device according to claim 1, wherein each of the plurality of pixel forming portions includes an electrophoretic element as a display element.

11. A display device comprising:
a scanning signal line drive circuit configured to drive a plurality of scanning signal lines, each connected to a plurality of pixel forming portions,
wherein the scanning signal line drive circuit includes a shift register having a plurality of stages corresponding to the plurality of scanning signal lines on a one-to-one basis and configured to operate based on a plurality of first clock signals and a plurality of second clock signals, each of the plurality of second clock signals having an amplitude that is greater than an amplitude of each of the plurality of first clock signals,
wherein a first unit circuit, among a plurality of unit circuits, that forms one of the plurality of stages included in the shift register includes:
a first output node configured to output a control signal for controlling an operation performed by a second unit circuit of the plurality of unit circuits,
a second output node configured to output a scanning signal to a corresponding one of the plurality of scanning signal lines.
a first control node configured to change from an off level to an on level based on a control signal output from a first output node of a third unit circuit of the plurality of unit circuits that forms a preceding stage,
a first output control transistor including a control terminal connected to the first control node, a first conduction terminal to which a corresponding one of the plurality of first clock signals is given, and a second conduction terminal connected to the first output node, and
a second output control transistor including a control terminal connected to the first control node, a first conduction terminal to which a corresponding one of the plurality of second clock signals is given, and a second conduction terminal connected to the second output node,
wherein a breakdown voltage of the second output control transistor is higher than a breakdown voltage of the first output control transistor,
wherein the first output control transistor is composed of P transistors connected in series, where P is an integer greater than or equal to 2, and
wherein the second output control transistor is composed of Q transistors connected in series, where Q is an integer greater than P.

12. The display device according to claim 11, wherein the first unit circuit further includes:
a set transistor, wherein the set transistor includes a control terminal and a first conduction terminal that are connected to the first output node of the third unit circuit that forms the preceding stage and a second conduction terminal that is connected to the first control node,
a reset transistor, wherein the reset transistor includes a control terminal that is connected to a first output node of a fourth unit circuit of the plurality of unit circuits that forms a succeeding stage, a first conduction terminal that is connected to the first control node, and a second conduction terminal to which an off level potential is given, and
a capacitor having one end connected to the first control node and another end connected to the second output node, and
wherein a breakdown voltage of each of the set transistor and the reset transistor is higher than the breakdown voltage of the first output control transistor and is lower than or equal to the breakdown voltage of the second output control transistor.

13. The display device according to claim 12, wherein a channel length of each of the set transistor and the reset transistor is greater than a channel length of the first output control transistor and is less than or equal to a channel length of the second output control transistor.

14. The display device according to claim 11, wherein the first unit circuit further includes a plurality of transistors in addition to the first output control transistor and the second output control transistor, and
wherein, among the plurality of transistors, a transistor having one of a first conduction terminal and a second conduction terminal connected to the first control node has a breakdown voltage that is higher than the breakdown voltage of the first output control transistor and is lower than or equal to the breakdown voltage of the second output control transistor.

15. The display device according to claim 11, wherein each of the plurality of pixel forming portions includes an electrophoretic element as a display element.

16. A display device comprising:
a scanning signal line drive circuit configured to drive a plurality of scanning signal lines, each connected to a plurality of pixel forming portions,
wherein the scanning signal line drive circuit includes a shift register having a plurality of stages corresponding to the plurality of scanning signal lines on a one-to-one basis and configured to operate based on a plurality of first clock signals and a plurality of second clock signals, each of the plurality of second clock signals having an amplitude that is greater than an amplitude of each of the plurality of first clock signals,
wherein a first unit circuit, among a plurality of unit circuits, that forms one of the plurality of stages included in the shift register includes:
a first output node configured to output a control signal for controlling an operation performed by a second unit circuit of the plurality of unit circuits,
a second output node configured to output a scanning signal to a corresponding one of the plurality of scanning signal lines,
a first control node configured to change from an off level to an on level based on a control signal output from a first output node of a third unit circuit of the plurality of unit circuits that forms a preceding stage,
a first output control transistor including a control terminal connected to the first control node, a first conduction terminal to which a corresponding one of the plurality of first clock signals is given, and a second conduction terminal connected to the first output node, and
a second output control transistor including a control terminal connected to the first control node, a first conduction terminal to which a corresponding one of the plurality of second clock signals is given, and a second conduction terminal connected to the second output node,
wherein a breakdown voltage of the second output control transistor is higher than a breakdown voltage of the first output control transistor,
wherein one of the first conduction terminal and the second conduction terminal of the second output control transistor includes a first electrode portion provided at one end in a channel length direction of the second output control transistor and a second electrode portion provided at another end in the channel length direction of the second output control transistor and electrically connected to the first electrode portion, and
wherein another one of the first conduction terminal and the second conduction terminal of the second output control transistor includes a third electrode portion provided between the first electrode portion and the second electrode portion so that a channel is formed between the third electrode portion and the first electrode portion and between the third electrode portion and the second electrode portion.

17. The display device according to claim 16, wherein the first unit circuit further includes:
a set transistor, wherein the set transistor includes a control terminal and a first conduction terminal that are connected to the first output node of the third unit circuit that forms the preceding stage and a second conduction terminal that is connected to the first control node,
a reset transistor, wherein the reset transistor includes a control terminal that is connected to a first output node of a fourth unit circuit of the plurality of unit circuits that forms a succeeding stage, a first conduction terminal that is connected to the first control node, and a second conduction terminal to which an off level potential is given, and a capacitor having one end connected to the first control node and another end connected to the second output node, and wherein a breakdown voltage of each of the set transistor and the reset transistor is higher than the breakdown voltage of the first output control transistor and is lower than or equal to the breakdown voltage of the second output control transistor.

18. The display device according to claim 17, wherein a channel length of each of the set transistor and the reset transistor is greater than a channel length of the first output control transistor and is less than or equal to a channel length of the second output control transistor.

19. The display device according to claim 16, wherein the first unit circuit further includes a plurality of transistors in addition to the first output control transistor and the second output control transistor, and wherein, among the plurality of transistors, a transistor having one of a first conduction terminal and a second conduction terminal connected to the first control node has a breakdown voltage that is higher than the breakdown voltage of the first output control transistor and is lower than or equal to the breakdown voltage of the second output control transistor.

20. The display device according to claim 16, wherein each of the plurality of pixel forming portions includes an electrophoretic element as a display element.

* * * * *